United States Patent
Cope et al.

(10) Patent No.: US 9,058,755 B2
(45) Date of Patent: Jun. 16, 2015

(54) LIGHTWEIGHT UNITARY DISPLAY

(75) Inventors: Richard Cope, Duluth, GA (US); Drew F. Meincke, Woodstock, GA (US); Daniel P. Bradbury, Cumming, GA (US); David Scott Rowley, Powder Springs, GA (US)

(73) Assignee: NanoLumens Acquisition, Inc., Norcross, GA (US)

( * ) Notice: Subject to any disclaimer, the term of this patent is extended or adjusted under 35 U.S.C. 154(b) by 714 days.

(21) Appl. No.: 13/231,950

(22) Filed: Sep. 13, 2011

(65) Prior Publication Data

US 2012/0236509 A1 Sep. 20, 2012

Related U.S. Application Data

(63) Continuation-in-part of application No. 12/348,158, filed on Jan. 2, 2009.

(60) Provisional application No. 61/019,144, filed on Jan. 4, 2008.

(51) Int. Cl.
| | |
|---|---|
| G09G 3/36 | (2006.01) |
| G09F 9/30 | (2006.01) |
| G02F 1/1333 | (2006.01) |
| G09F 9/33 | (2006.01) |
| G09G 3/20 | (2006.01) |
| G09G 3/32 | (2006.01) |

(52) U.S. Cl.
CPC ............ *G09F 9/30* (2013.01); *G02F 1/133305* (2013.01); *G09F 9/33* (2013.01); *G09G 3/20* (2013.01); *G09G 3/2088* (2013.01); *G09G 3/32* (2013.01); *G09G 2300/04* (2013.01); *G09G 2300/0426* (2013.01); *G09G 2380/02* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 2005/0078104 A1* | 4/2005 | Matthies et al. | 345/204 |
| 2005/0117086 A1* | 6/2005 | Sugahara et al. | 349/58 |
| 2010/0090995 A1* | 4/2010 | Chung et al. | 345/205 |

* cited by examiner

*Primary Examiner* — Adam R Giesy
(74) *Attorney, Agent, or Firm* — Theodore Heske III

(57) ABSTRACT

A lightweight display includes a plurality of display modules having a plurality of pixels carried by a display mounting frame. A support frame integral with the display mounting frame provides support. An electronic support member carries electrical components electrically communicating with the plurality of display modules for controlling the display of an image. Wherein the depth of the plurality of display modules, display mounting frame, support frame and electronic support member is less than four inches when defining a display assembly. Also wherein the display assembly has a screen size measured diagonally in a range of 114 inches to 224 inches and a weight in the range of 90 pounds to 120 pounds and wherein the display assembly has an aspect ratio ranging from 1.67 to 1.82.

18 Claims, 27 Drawing Sheets

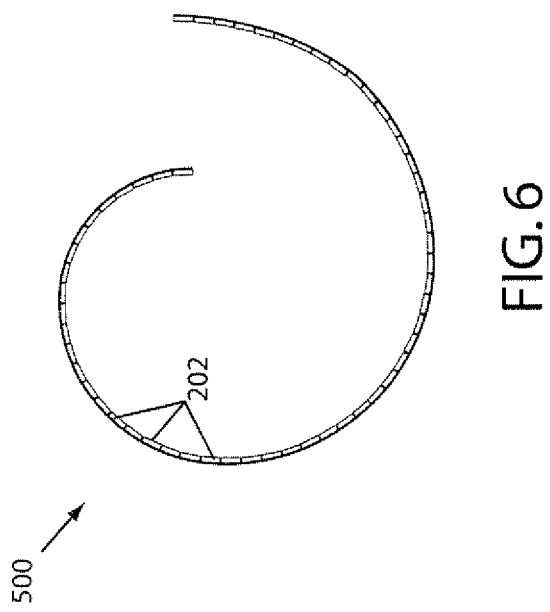

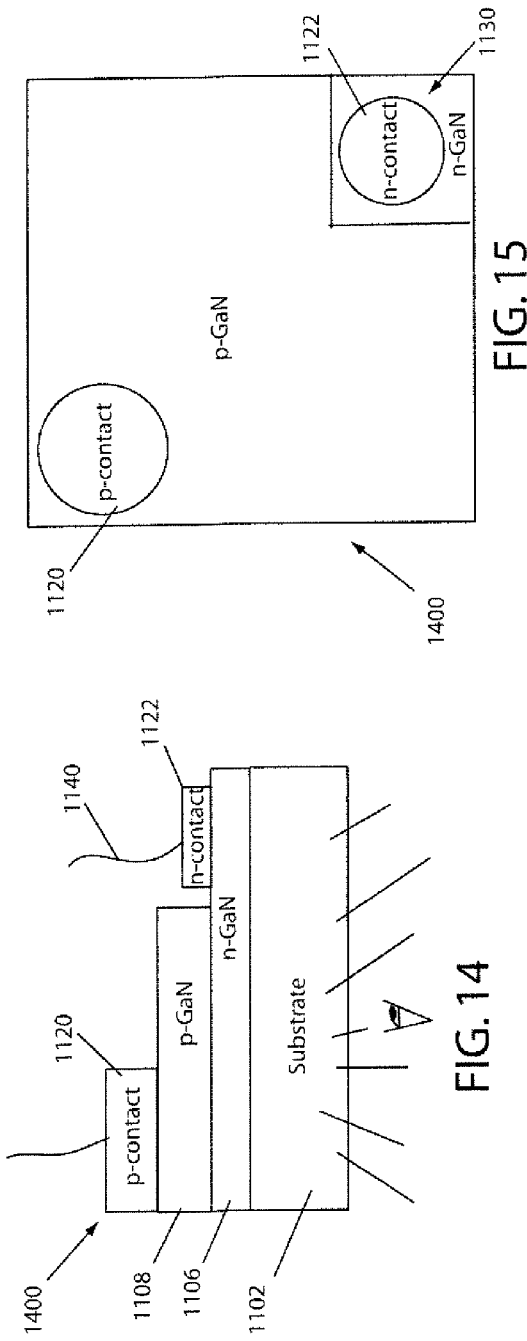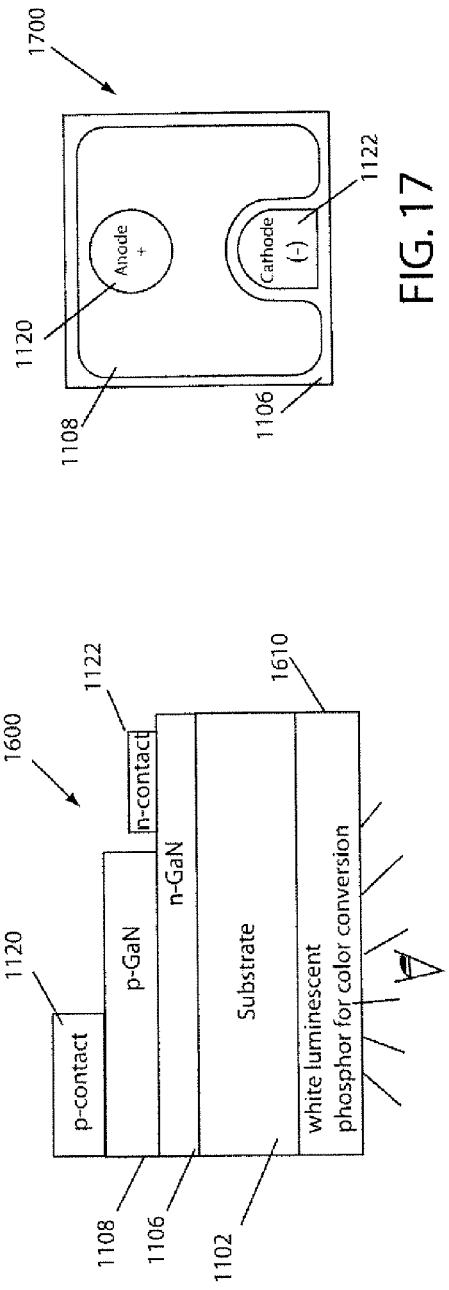

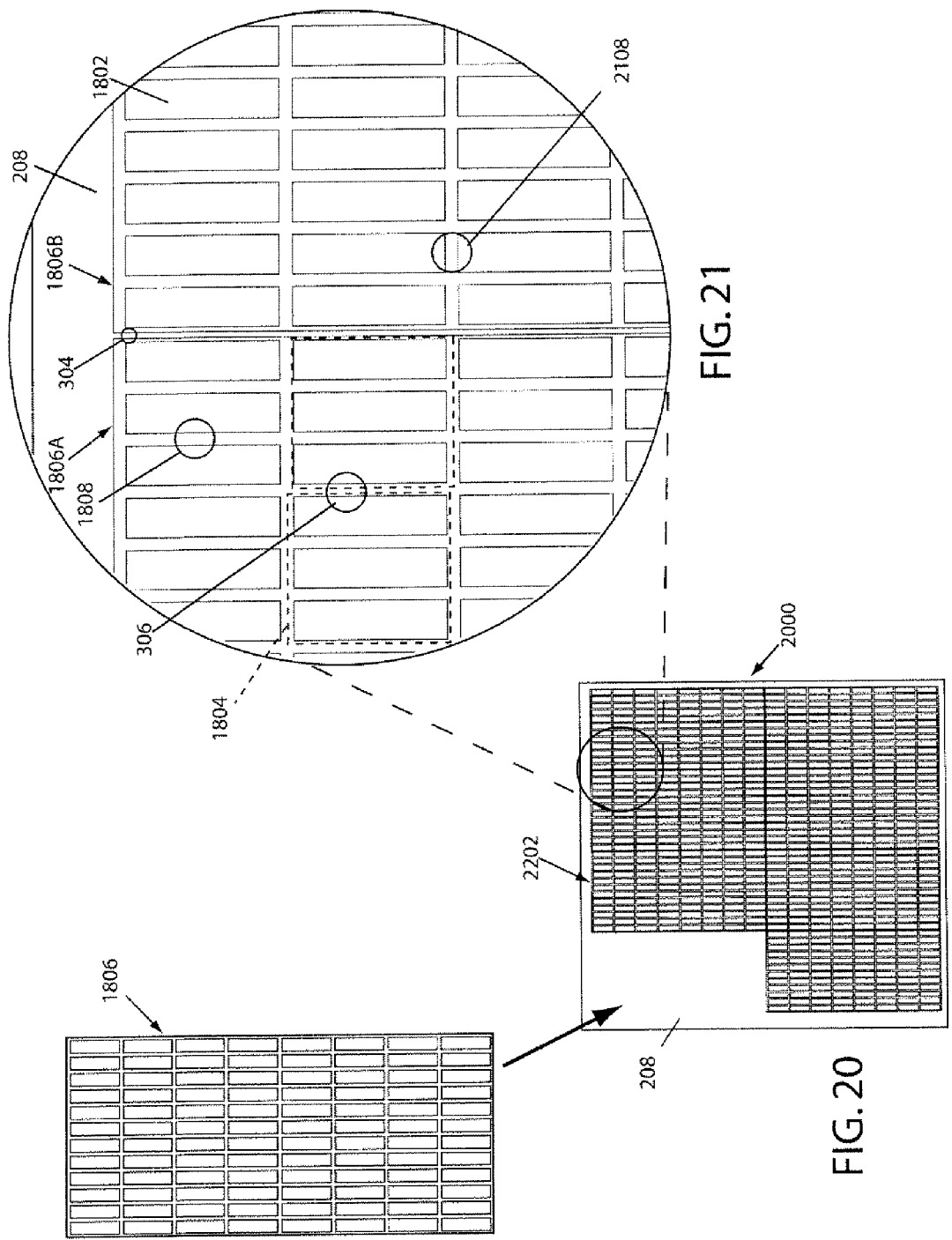

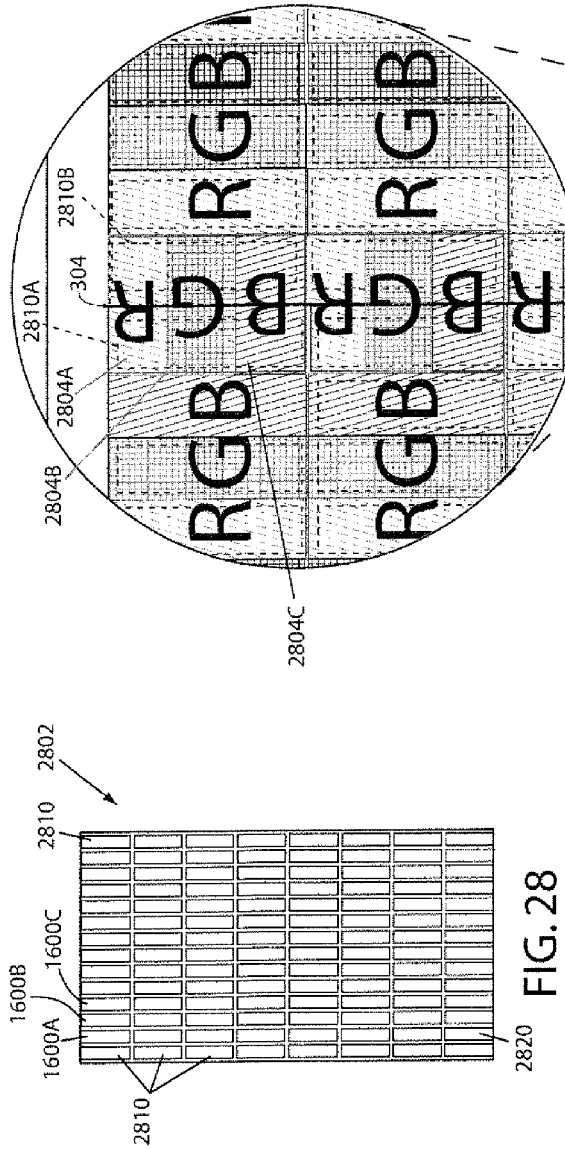
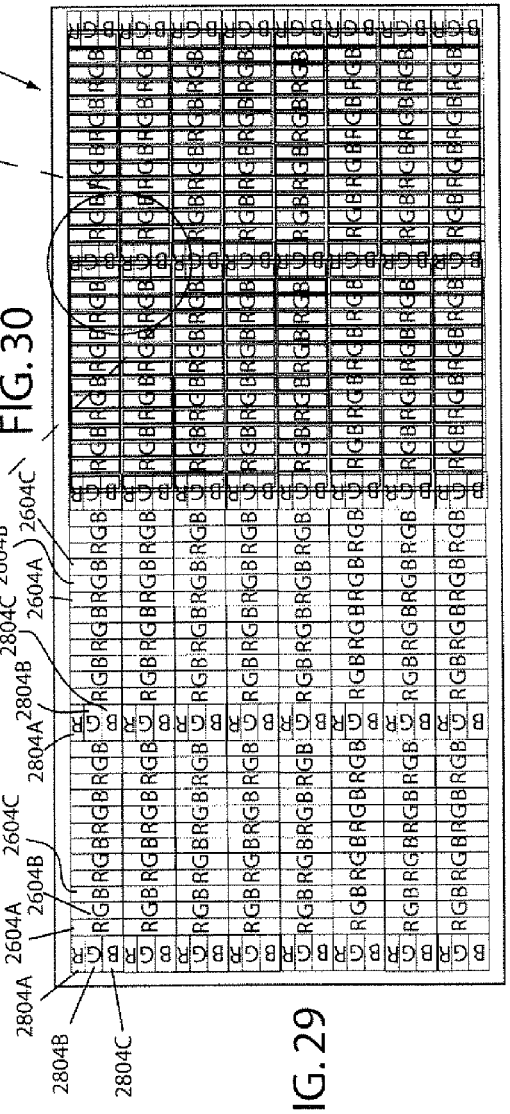
FIG. 28
FIG. 29
FIG. 30

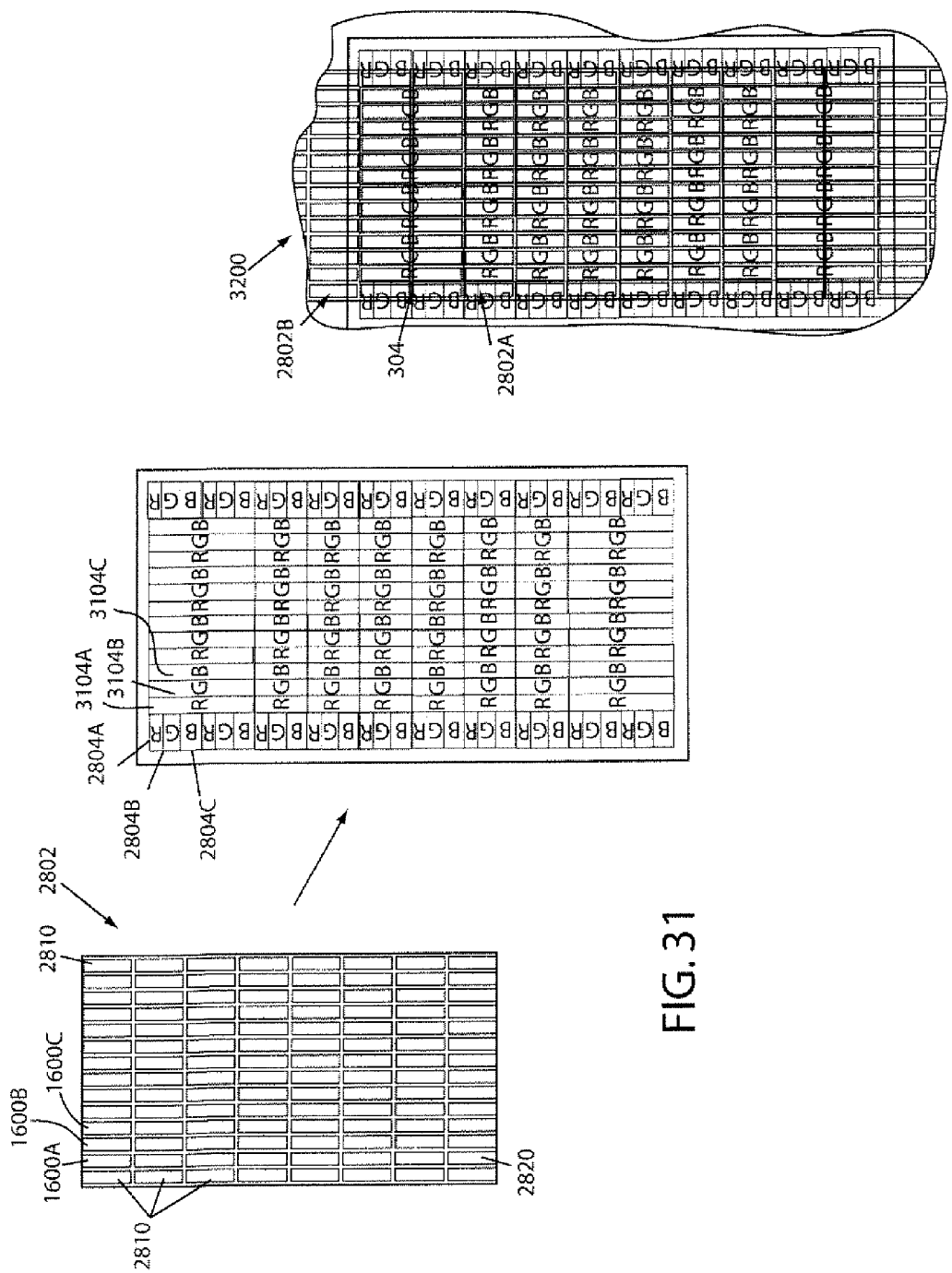

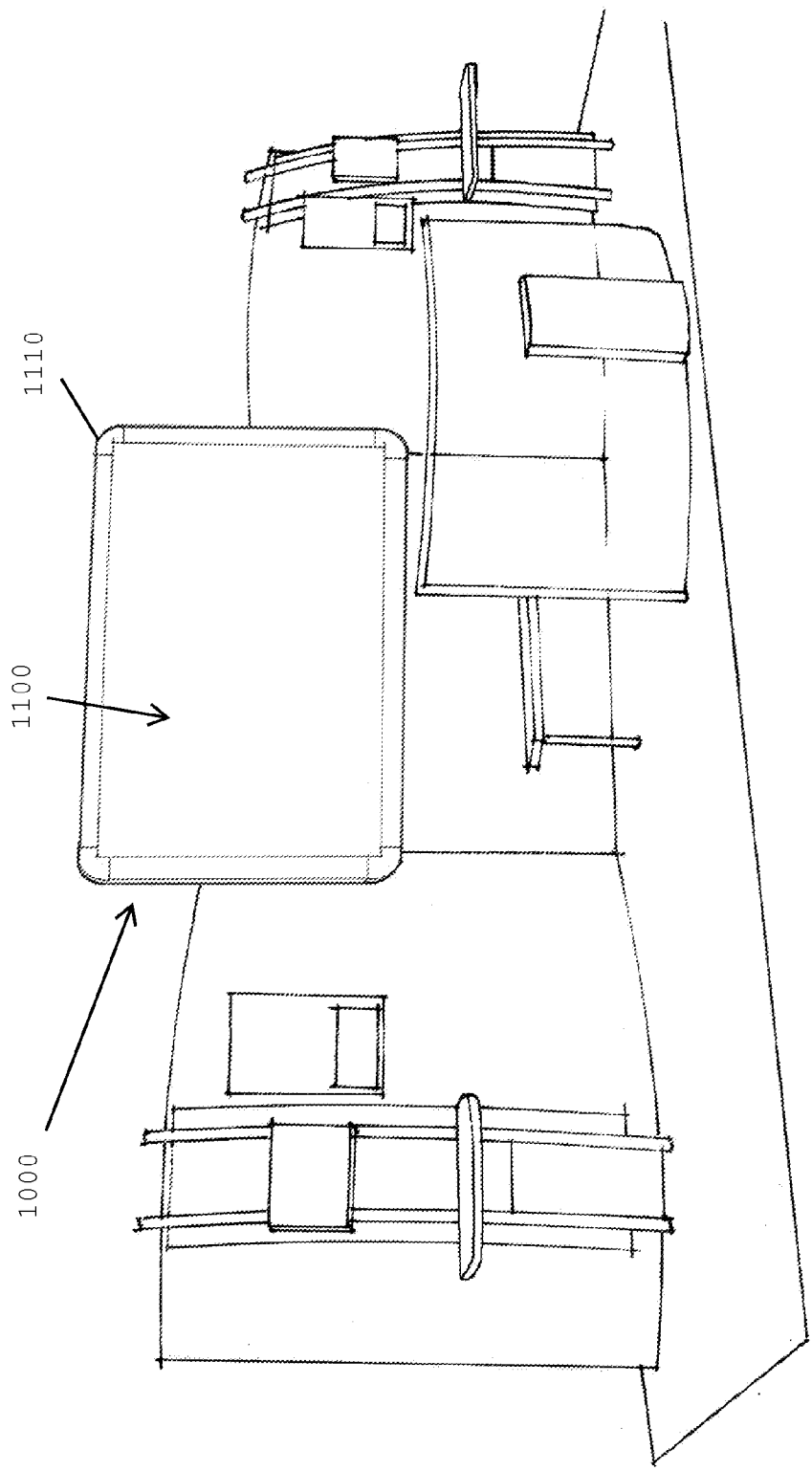

LIGHTWEIGHT UNITARY DISPLAY

CROSS REFERENCES TO RELATED APPLICATIONS

This application is a continuation in part of and claims priority to U.S. Utility application Ser. No. 12/348,158 entitled Flexible Display filed on Jan. 2, 2009 which claimed priority from U.S. Provisional Patent Application No. 61/019,144 filed on Jan. 4, 2008.

FIELD OF INVENTION

The present invention relates to display devices. More particularly, the present invention relates to a modular display assembly having easily accessible and removable panels of pixel assemblies positioned along a true plane for providing a lightweight, mobile display which reduces off-axis distortion.

BACKGROUND

The electronic signage industry incorporates a wide range of design configurations. Each sign utilizes some aspect of lighting incorporated into a frame housing and typically is constructed for is intended environment. For instance certain designs include outdoor billboards and signage utilized in stadiums. These designs are primarily constructed to be very heavy and secure and to project large images without necessarily taking into consideration certain attributes of the projected image such as off-axis viewing. Presently, large scale displays tend to be heavy, expensive, not easily transported and set up, and power hungry.

For interior purposes it is known to utilize typically square modules having LED's and the like which are stacked in various configurations to create the desired design. Such modules are provide by Daktronics of South Dakota and identified as mobile and modular products at www.daktronics.com/productservices/products/video/mobilemodular/pages/default.asp. While suitable for their intended purpose and portable, these modules are intended for use at concerts, auto shows, or sporting events and are large.

U.S. Pat. No. 7,694,444 entitled Electronic Sign having a formed metal cabinet and assigned to Daktronics identifies a metal cabinet for housing a plurality of modules wherein the cabinet and associated support structure for the modules may be rapidly assembled. Such construction also provides for rear access enabling the light modules to be accessed from the rear should maintenance and the like be required. Furthermore, this patent discloses that the respective display modules are attached to a mounting panel as described in U.S. Pat. No. 7,055,271 entitled Electronic Display Module having a Four-Point Latching System for Incorporation Into an Electronic Sign and Process. This latching system includes a four-point latching system having gears and actuating arms to position latch arms outwardly over a mounting panel assembly followed by a pivotal latch positioning to rotationally engage the latching arms against the mounting panel assembly to secure the display module to the mounting panel assembly. Such a latching system would be necessary for large scale systems or for hostile ambient environments. However, such a construction does not lend itself to a light weight, or mobile display suitable for indoor purposes. Additionally the cabinets are intended to be matched with other such cabinets in a modular fashion for creating an overall display comprised of multiple cabinets. Such construction of multiple cabinets is incapable of providing a flat planar construction in all planes thereby minimizing distortion of off-axis viewing.

Accordingly, there is a need for a lightweight design which is easy to assemble and is mobile.

SUMMARY OF THE INVENTION

A lightweight display includes a plurality of display modules having a plurality of pixels carried by a display mounting frame. A support frame integral with the display mounting frame provides support. An electronic support member carries electrical components electrically communicating with the plurality of display modules for controlling the display of an image. Wherein the depth of the plurality of display modules, display mounting frame, support frame and electronic support member is less than four inches when defining a display assembly. Also wherein the display assembly has a screen size measured diagonally in a range of 114 inches to 224 inches and a weight in the range of 90 pounds to 120 pounds and wherein the display assembly has an aspect ratio ranging from 1.67 to 1.82.

BRIEF DESCRIPTION OF THE DRAWINGS

FIG. 6 shows a flexible display which incorporates square-shaped chixels of FIG. 5.

FIG. 14 shows a side view of an LED of a chixel in accordance with one embodiment of the invention.

FIG. 15 shows a top view of the LED of FIG. 14.

FIG. 16 shows a white light emitting LED of a chixel in accordance with one embodiment of the invention.

FIG. 17 shows an alternative embodiment of a chixel LED.

FIG. 20 shows the chixel of FIG. 19 incorporated into a display.

FIG. 21 sows an enlarged portion of the display of FIG. 20.

FIG. 28 shows one embodiment of a chixel having additional edge light emitters.

FIG. 29 shows a color flexible chixel-based display incorporating the chixel of FIG. 28.

FIG. 30 shows an enlarged portion of the display of FIG. 29.

FIG. 31 shows one embodiment of filter pattern.

FIG. 32 shows one chixel and filter arrangement.

FIG. 33 is a perspective view of a light weight electronic sign according to an additional embodiment of the present invention.

FIGS. 42 and 42A illustrate the mounting system of an additional embodiment of the present invention.

DETAILED DESCRIPTION

As required, exemplary embodiments of the present invention are disclosed herein. These embodiments are meant to be examples of various ways of implementing the invention and it will be understood that the invention may be embodied in alternative forms. The figures are not to scale and some features may be exaggerated or minimized to show details of particular elements, while related elements may have been eliminated to prevent obscuring novel aspects. Therefore, specific structural and functional details disclosed herein are not to be interpreted as limiting, but merely as a basis for the claims and as a representative basis for teaching one skilled in the art to variously employ the present invention.

For purposes of teaching and not limitation, the exemplary embodiments disclosed herein are discussed mainly in the context of LED light emitter technologies. However, the present invention is applicable to other light emitting technologies as well, such as, by way of example and not limitation, backlit LCDs, electroluminescence, or plasma tubes or cells.

Figure 1:
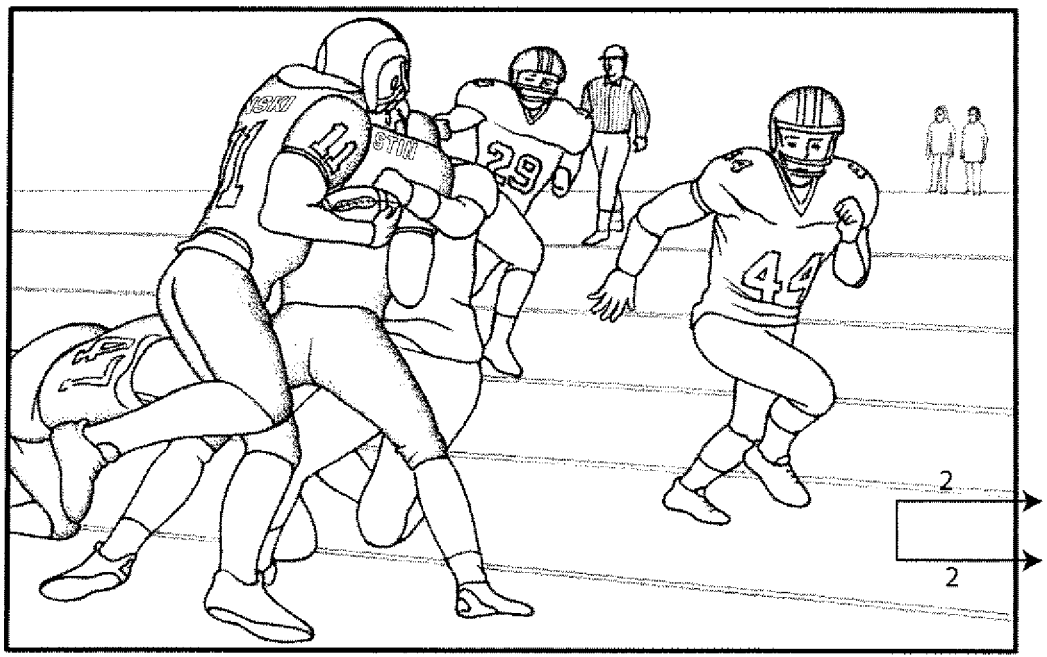
FIG. 1 shows a flexible display in accordance with one embodiment of the invention.
Figure 2:
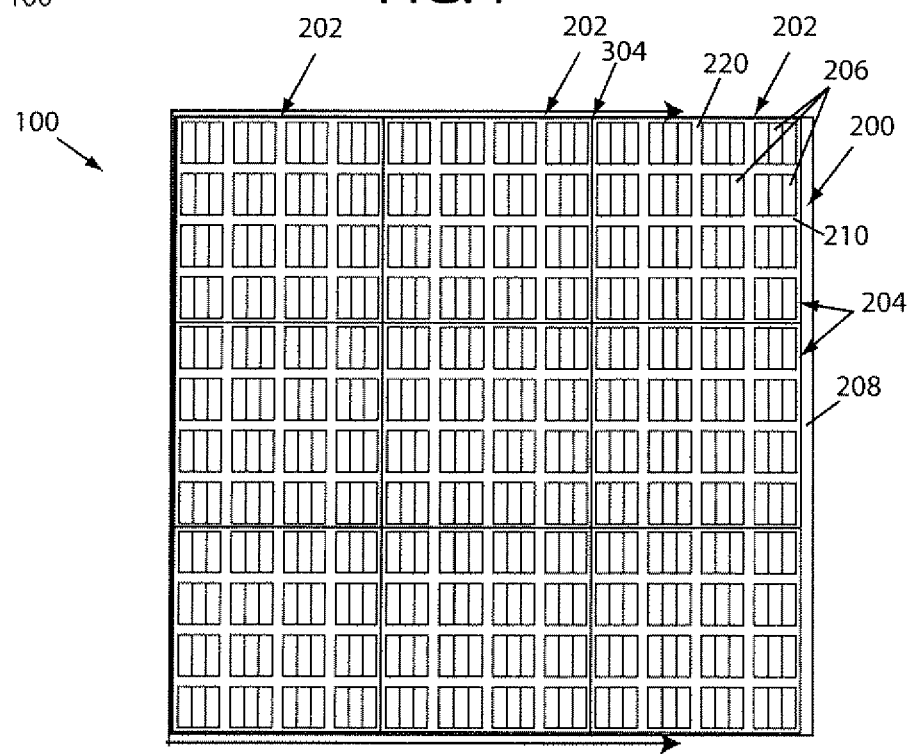
FIG. 2 shows an enlarged view of a portion of the display of FIG. 1 along cut line 2-2.

Turning to the figures where like elements have like reference numbers throughout the several views, FIG. 1 shows an exemplary embodiment of a flexible display 100. As shown in FIG. 2, the flexible display 100 is comprised of a plurality of pixel chips 202, referred to herein as chixels 202, that are arranged in a chixel arrangement 200. The chixels 202 may be rigid self-contained components that include a plurality of pixels 204, formed of subpixels 206. The chixels 202 are of a sufficiently small size and attached to a flexible display substrate 208 in such a manner that the space between the chixels, referred to herein as a chixel gap 304, allows the flexible display substrate 208 to have a bending radius to provide a desired flexibility to the display 100.

Figure 3A:
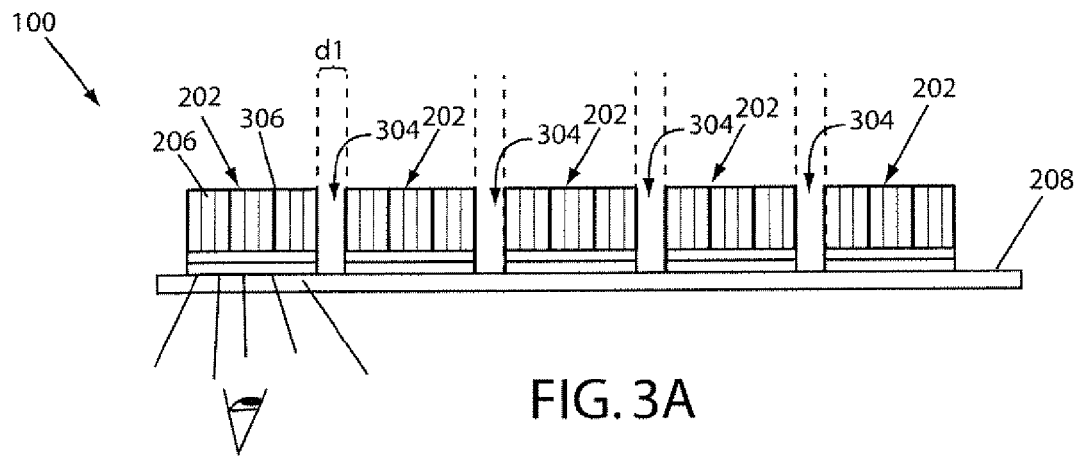
FIGS. 3A-3B show a side view of a flexible chixel display in accordance with one embodiment of the invention.
Figure 3B:
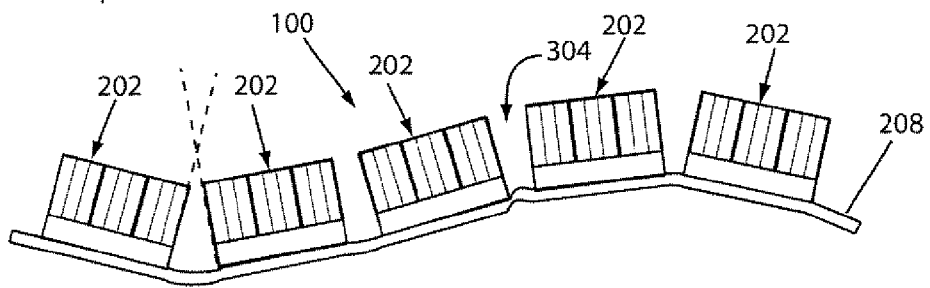

For example, as shown in FIG. 3A, chixels 202 are provided on a flexible display substrate 208 with a chixel gap 304 of a size so that the side edges of the chixels are parallel when the substrate 208 is flat. As shown in FIG. 3B, as the substrate 208 flexes, the chixels 202 move at angles with respect to one another due to the bending of the substrate 208 at the chixel gaps 304. Although shown as square chixels 202 with sharp upper corners, the chixels 202 could have rounded corners or other shapes to prevent contact between adjacent chixels 202 during bending of the substrate 208. Furthermore, the chixels 202 could be shaped so as to limit or prevent flexing of the substrate in a particular direction. For example, the chixels could have extensions (not shown) that contact each other to limit movement when the display is flexed in a particular direction. The size of the chixels and spacing between the chixels could also be varied to provide desired flexibility. For example, smaller chixels could be used on portions of the display which require more flexibility and larger chixels used on portions with lower flexibility requirements.

The chixels 202 are of a predetermined shape and arranged in a desired pattern on a flexible substrate 208 to form a flexible display 100. The size, shape, and arrangement of the chixels 202 may be selected to provide a desired bend radius to the flexible substrate 208 to which the chixels 202 are incorporated.

Figure 4:
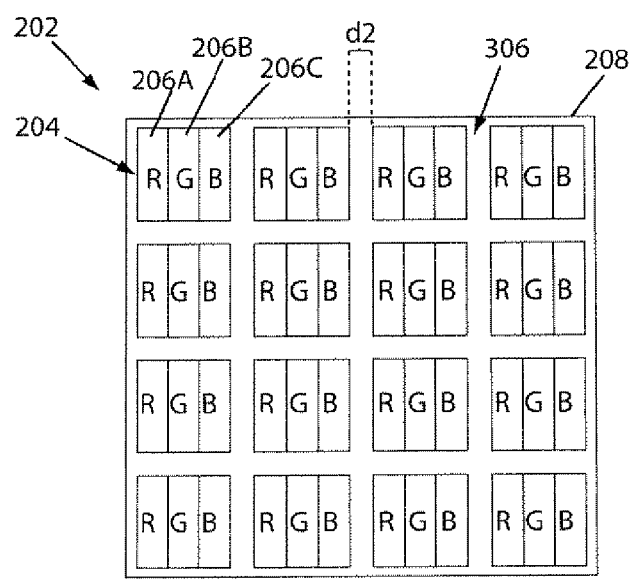
FIG. 4 shows a chixel in accordance with one embodiment of the invention.
Figure 5:
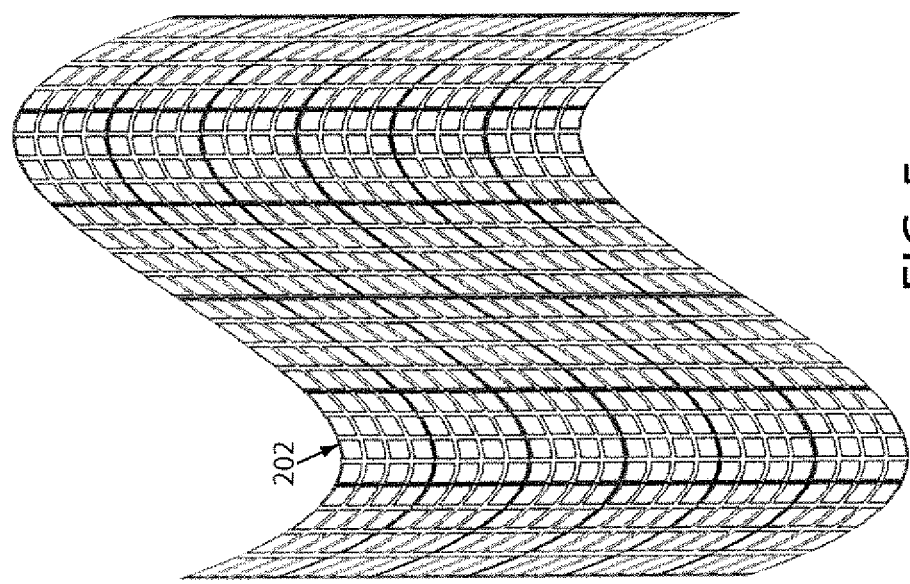
FIG. 5 shows a flexible display which incorporates square-shaped chixels in accordance with one embodiment of the invention.

As shown in an exemplary embodiment in FIG. 4, a chixel 202 may be generally square in shape. For example, the chixel may comprise a 4 by 4 array of 16 pixels 204, each pixel having three subpixels 206. As shown in FIG. 5, this square shape allows a chixel-based display 500 in which the chixels 206 are incorporated to flex easily both horizontally and vertically between the chixels 202 as the ratio of vertical and horizontal chixels gaps 304 is the same. FIG. 6 shows a chixel display having chixels 202 on a flexible substrate with sufficient bend radius to be rolled up into a tube.

Chixels 202 may be provided in other shapes and arranged to provide a chixel gap 304 of an appropriate size to provide the display 100 with a desired amount of flexibility. Generally, the smaller the chixel 202, the greater the number of chixel gaps 304 in the display in which the chixels are incorporated and the greater the number of bending points that can be provided and, therefore, the greater the flexibility of the display. For example, if it is desirable to provide a greater amount of flexibility in one direction of the substrate than another then the chixels can be shaped to provide such flexibility by arranging a larger number of flexible gaps in the one direction than the other.

Figure 8:
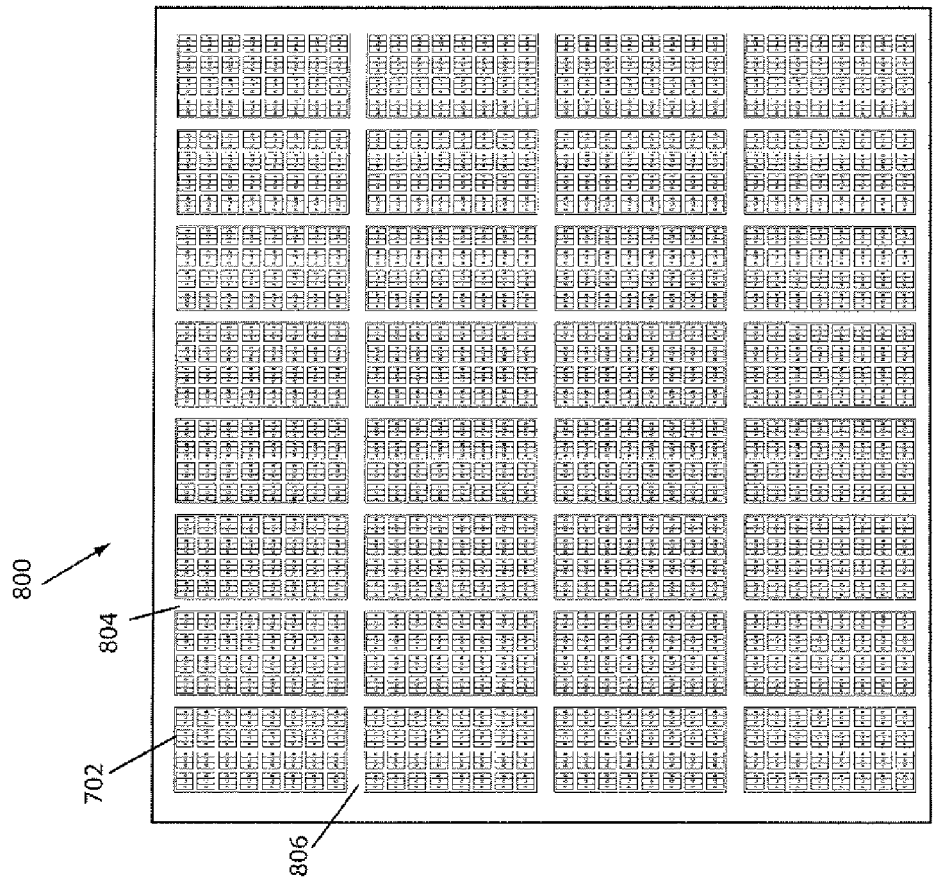
FIG. 8 shows a flexible display incorporating the elongated chixels of FIG. 7.
Figure 7:
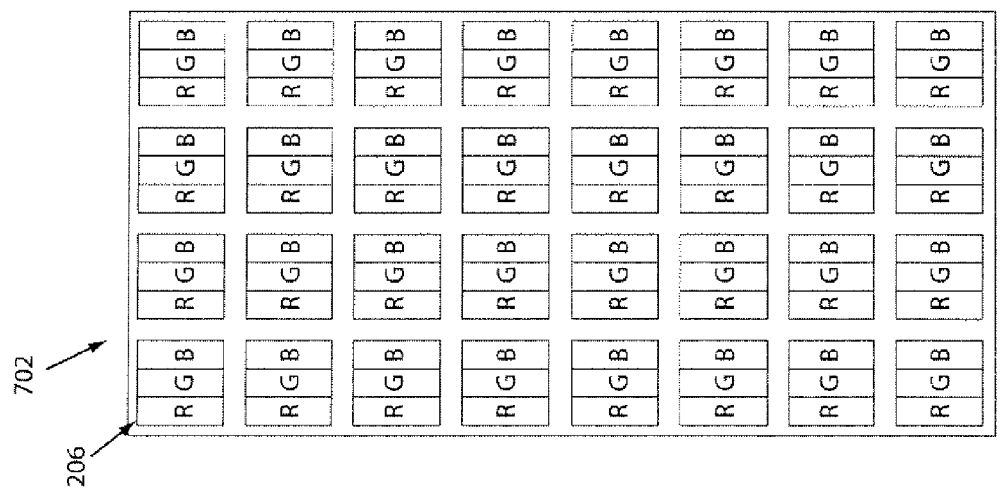
FIG. 7 shows an elongated chixel in accordance with one embodiment of the invention.

The chixel 702 shown in FIG. 7 includes a 4 by 8 pixel arrangement. As shown in FIG. 8, this allows for greater lateral bending because there are approximately twice as many vertical bending points 804 in the display than horizontal bending 806 points. Although the smaller the chixel, the greater the number of chixel gaps and the greater the flexibility of the display, the fewer the number of pixels that can be provided on the chixel and/or the smaller the pixels. Thus, while having smaller chixels increases flexibility, having larger chixels increases the size and/or number of pixels that can be provided on each chixel and decreases the number of chixels that must be attached to the flexible substrate. Thus, smaller chixels could be used in areas of the display with higher flexibility requirements.

As shown in FIG. 4, a chixel 202 may include pixels 204 that are comprised of subpixels 206. The subpixels 206 may have different properties in order to provide desired properties for the pixel 204 of which they form a part. For example, the pixels 204 may comprise red 206A, green 206B, and blue 206C subpixels that together form an RGB pixel. The intensity of the individual subpixels 206A, 206B, 206B can be manipulated to provide light having desired characteristics, such as a desired light color or brightness. The subpixels 206 may have a rectangular shape so that together they form a square-shaped pixel 204. The pixels 204 may be provided in a 4.times.4 array on a rigid substrate 220 to form a chixel of about 4 mm. The substrate 220 may be transparent to allow light emission through the substrate. For example, the substrate may be rigid glass or sapphire as discussed in more detail below. The pixels 204 may be provided at a distance apart from one another, the distance referred to as a "pixel gap" 304. In an exemplary embodiment of a chixel, a plurality of light emitters is provided on a rigid substrate and serves as subpixels of a display. The subpixels may be divided into groupings, such as groupings of three subpixels, to form pixels. For example, subpixels that emit red, green and blue light may be grouped together to form an RGB pixel. Other arrangements, such as by way of example and not limitation, include a monocolor display in which all subpixels or pixels emit the same color light. Additionally, the light emitted by the pixels or subpixels may be converted or filtered to provide the desired light output; for example, the pixels could be formed of blue LEDs that are filtered or are color converted and filtered.

The subpixels may be of rectangular shape so that when combined with other subpixels they form a square pixel. The pixels may be arranged on the substrate such that the space between adjacent pixels, referred to herein as a "pixel gap," is of a desired distance d1. Because there are no pixels to produce light at the pixel gap, the gap may appear as a darkened area of a display, referred to as a "pixel gap line." Similarly, the subpixels may be uniformly spaced so that space between subpixels, the "subpixel gap", is of a desired size.

In one aspect of the invention, the pixels are of a size relative to the pixel gap to make the pixel gap line less noticeable to a viewer. For example, the pixels may be of a size relative to the size of the pixel gap so as to provide a display of a desired resolution in which the pixel gap is not as pronounced or distracting to the viewer. This relationship and sizing may depend on a number of factors, including, but not limited to, viewing distance, contrast ratio, brightness, and viewing environment.

The size of the pixel gap 304 may vary depending upon the particular light emitting technology used for the subpixel 206. For example, some light emitters may require conductors that extend around the edge of the emitter, which prevents the light emitters from directly abutting each other, thereby resulting in large subpixel and pixel gaps. For example, Organic Light Emitting Diodes (OLEDS) generally require that current be provided through the front of the display and a contact is commonly arranged to extend around the edge of the OLED, thereby preventing OLEDs from being tightly packed in a display.

One problem with prior art displays is that the pixel gap 304 is of such size that gap lines are visible in the resulting display which is distracting to a viewer and renders an image of poorer quality. This led to prior art attempts to provide front conductors for the pixels. This front conductor approach raises additional problems in producing flexible displays, however, due to the limited flexibility and high resistance values of known transparent front electrodes.

In one aspect of the present invention, the pixels 204 are sized relative to the pixel gap 306 between the pixels 204 such that the pixel gap 306 is less noticeable to an observer. For example, in a prior art OLED device the gaps between pixels that are required for the wrap-around electrodes can result in a pixel gap to pixel area ratio that is readily noticeable to a viewer of the display.

In the present invention, pixels 204 are sized relative to the pixel gap 306 so that the gap line is less noticeable while still providing a desired resolution. One advantage of the present invention is that if a 4 mm chixel 202 which includes 16 pixels in a 4 by 4 array is used to provide the pixels for the display, the number of operations to provide the pixels 204 to the display is 1/16 of that of a technique that attempts to attach individual pixels to a display because multiple pixels are added with a single chixel. As discussed in more detail below, minimizing the effect of the gap line allows for the use of manufacturing techniques and resulting structures that were previously avoided due to concerns over gap lines. For example, by adjusting the pixel size to the pixel gap to minimize the effect of a gap line allows for electrodes to extend around the side of a pixel and allow a display to be driven at the rear, thereby eliminating some of the problems with prior art devices that are front driven.

Figures 9, 10:
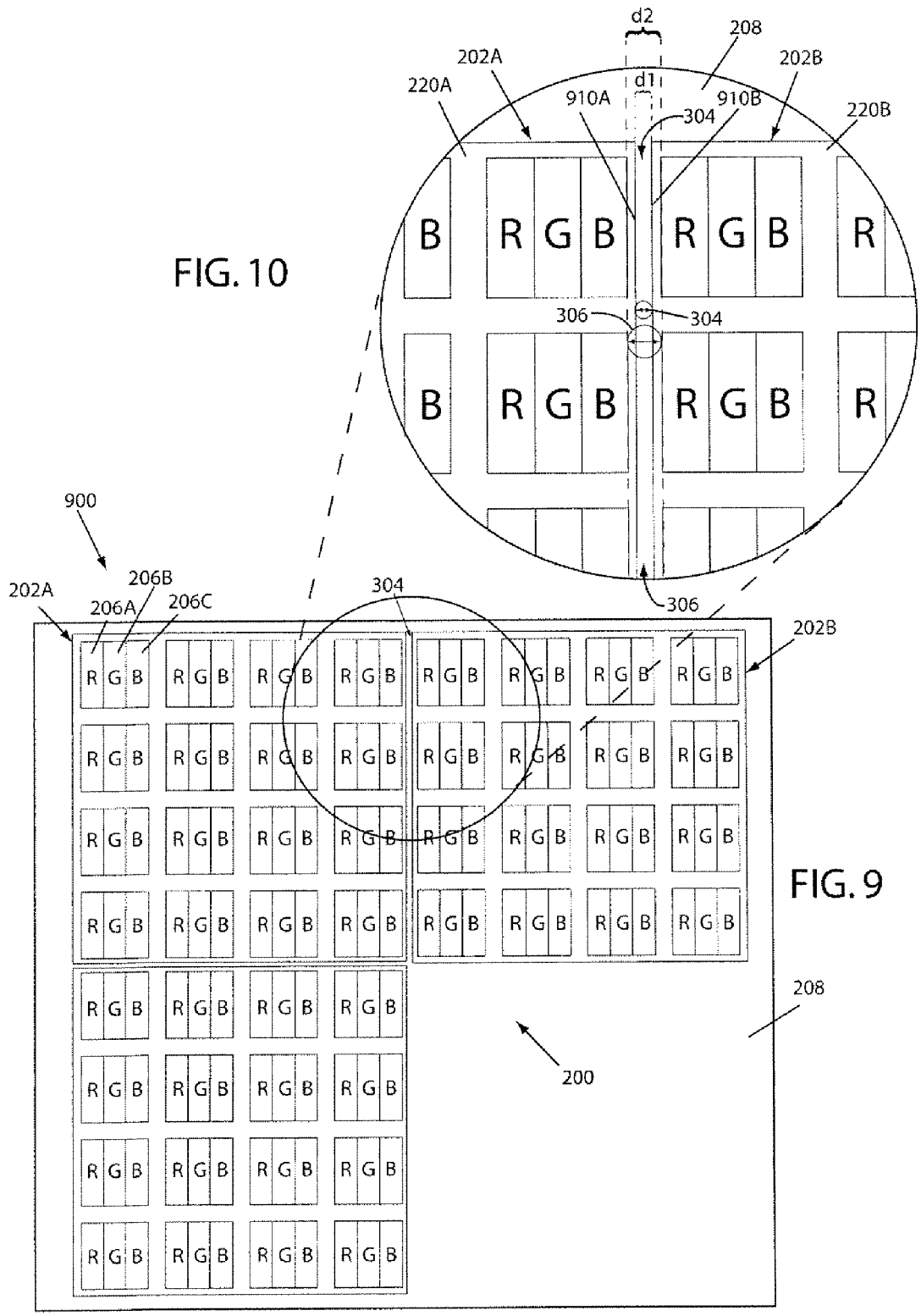
FIG. 9 shows a chixel-based display in accordance with one embodiment of the invention.
FIG. 10 shows an enlarged portion of the chixel-based arrangement of FIG. 9.

As shown in FIG. 9, chixels 202 may be coupled to a flexible display substrate 208 by an adhesive or other coupling means. The pixels 204 can be arranged on the chixel 202 with uniform pixel spacing of a pitch or pixel gap d2. The chixels 202 can be arranged on the flexible display substrate 208, to maintain the uniform pixel gap 304 d2 between adjacent chixels 202A, 202B. For example, the pixels 202 may be located near the edges 910A-B of the chixels 202 and adjacent chixels 202A-B arranged so that the pixel gap 306 is uniform between pixels 204 even across adjacent chixels 202A, 202B. As discussed above, the chixel gap 304 between the chixels 202 provides a desired bend radius to the flexible substrate 208 that allows the display 100 to flex. Thus, a uniform pixel gap and a desired flexibility can be obtained; in other words the pixel pitch is consistent in both the rows and columns, even between pixels on the edges of two adjacent chixels. In one exemplary embodiment the pixel gap may be 320 micron, the chixel gap 320 micron and the pixel size 1600 micron.

As discussed in more detail below, the flexible substrate 208 may comprise a variety of layers, such as by way of example and not limitation, a contrast layer, a diffusion layer, a filter layer, and an anti-reflection layer. Each of these layers may be of a flexible plastic type. Thus, even though the chixels 202 themselves may be rigid, a sufficient number of chixel gaps 304 are provided in an appropriate arrangement that a desired bend radius of the flexible substrate 208 is obtained.

Figure 11:
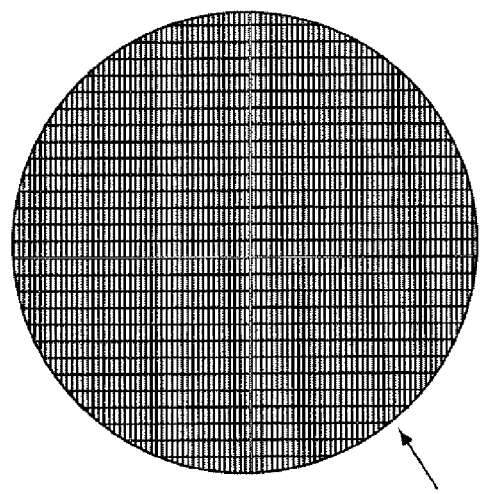
FIG. 11 shows an LED wafer in accordance with one embodiment of the invention.
Figure 12:
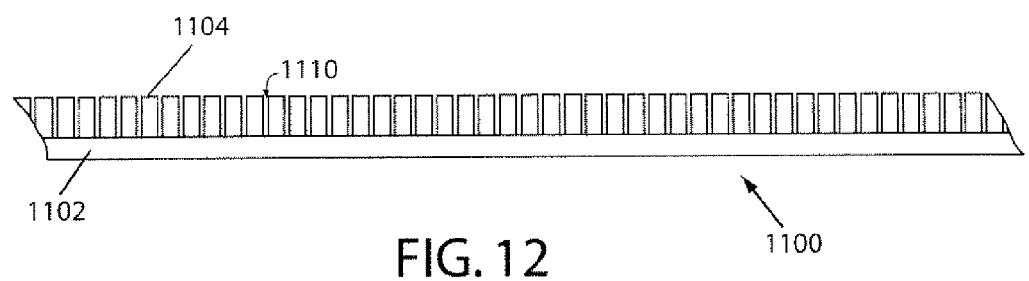
FIG. 12 shows a side view of the wafer of FIG. 11.
Figure 13:
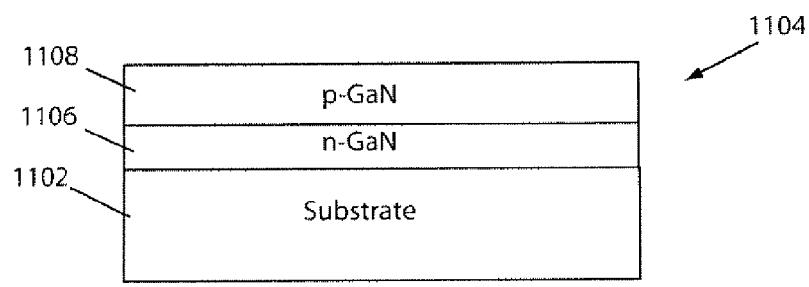
FIG. 13 shows an LED stack of the wafer of FIG. 11.

Chixels 202 may employ different light emitting technologies, such as LED, electroluminescence, plasma tubes or cells, and backlit LCD. FIGS. 11 and 12 show an exemplary method of manufacturing an LED-based chixel. An LED is formed by depositing an n-doped semiconductor and a p-doped semiconductor layer on a substrate. Light is formed at the p-n junction when it is excited by electrical current. As shown in FIG. 11 an LED wafer 1100 may be produced that includes a plurality of spaced apart LED stacks 1104 that, as discussed in more detail below, may serve as light emitters for a flexible display. As shown in FIG. 12 the LED wafer 1100 may comprise a rigid substrate 1102 having a plurality of LED stacks 1104 thereon. For example, as shown in FIG. 13 an LED stack 1104 may include a p-doped layer 1106 and an n-doped layer 1108 that are provided atop a sapphire substrate 1102 and have the appropriate properties to emit light when supplied with an appropriate charge (current). Various techniques can be used to create the LED stacks with great accuracy. Portions of the layers 1106, 1108 may be removed to create separate LED stacks on the rigid substrate separated from one another by a gap 1110 that generally corresponds to a subpixel or pixel gap of a completed display. For example, a mask may be applied and etching techniques used to etch channels through the upper layers 1106, 1108 down to the substrate to produce stacks that share a common substrate 1102. In an exemplary embodiment LED stacks may be generally square having a length of about 320 .mu.m and a width of about 320 .mu.m and a gap between the LED stacks 1104 of about 50 .mu.m. Applicant has found that a layer of n-GaN of about 0.2 .mu.m thickness and a p-GaN layer of about a 0.2 .mu.m thickness on a sapphire substrate of a thickness of about 350 .mu.m can be used to produce LEDs that emit blue light having a wavelength of about 450 nm. Different layers may be used or additional layers added to the LED stacks to obtain LEDs that emit light with desired characteristics. Furthermore, as discussed in more detail below, filters, photoconverters, and other apparatus may be used to manipulate the light emitted from the LEDs.

In order to make the LED stacks 1104 into workable LEDs, a p-contact 1120 and an n-contact 1122 may be provided to the stacks 1104 as shown in FIG. 14 to form an LED 1400. The p-contact 1120 may be provided in a cutout area 1130 of the p-doped layer 1108. For example, an etching process may be used to remove a portion of the p-doped layer to allow the n-contact 1122 to be placed directly on top of the n-doped layer 1106. This allows the p-contact to be placed directly atop of the n-doped layer 1106 and conductors 1140 to extend upward from the LED to a rear mounted display driver when the LEDs are incorporated into a display. This obviates the need of providing a large space between the light emitters for providing a pathway for conductors running along the edge and side of the light emitter and thereby allows the LEDs to be tightly packed. The wafer may be processed by etching, ablation, or other known techniques to form LEDs of various shapes, such as the LED 1700 shown in FIG. 17 and arranged in a desired arrangement.

Additional layers can also be added to the LEDs 1400. For example, as shown in an exemplary LED 1600 in FIG. 16 a luminescent phosphor layer 1610, typically a powder phosphor formulated based on the light output of the LED to provide the best conversion, may be provided for color conversion, to convert the emitted blue light to white. The color conversion layer 1610 may be added by known techniques. As shown in FIGS. 14 and 16 when an appropriate current is applied, light is transmitted downwardly from the LED 1400, 1600. Thus, in these embodiments the substrate 1102 is transmissive.

The wafer 1100 may include different layers on different LED stacks to provide different light characteristics. For example, different layers could be used to produce red, blue, and green light from different LED stacks 1104. The wafer 1100 could also be made of uniform LED stacks 1104 having the same or similar properties. For example, the LED stacks 1104 could be constructed to emit white light or blue light which could then be filtered to produce light with desired characteristics. In the exemplary embodiment shown in FIG. 14 in which GaN layers are used, blue light is emitted. Filters may also be used to provide red, green and blue LEDs which could define red, green and blue subpixels of an RGB pixel display. As seen in FIG. 16 a white phosphor photoconversion layer 1610 can be applied so that the light emitted from the LED 1600 is white which is more efficiently filtered than blue light.

Figure 19:
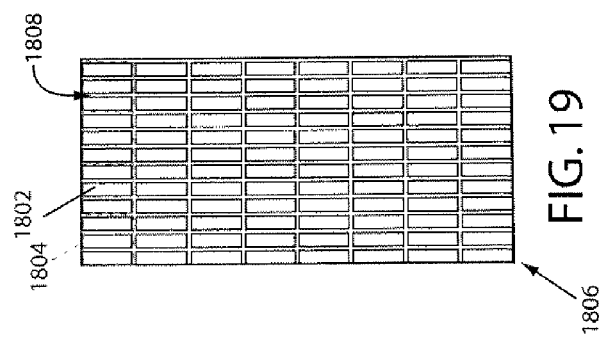
FIG. 19 shows a chixel separated from the LED wafer of FIG. 18A in accordance with an exemplary embodiment of the invention.
Figure 18B:
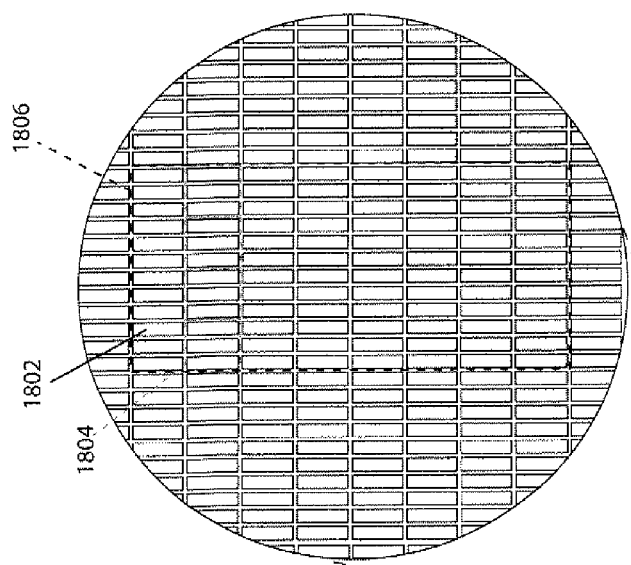
FIG. 18B shows an enlarged portion of the LED wafer of FIG. 18A.
Figure 18A:
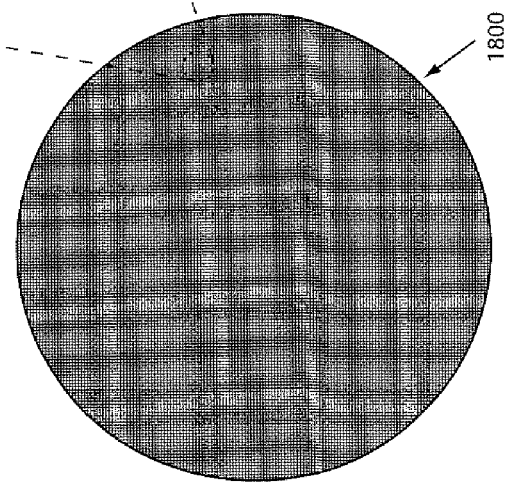
FIG. 18A shows a top view of an LED wafer in accordance with an exemplary embodiment of the invention.

As shown in FIGS. 18A-B an LED wafer 1800 may include an array of uniformly spaced rectangular-shaped LEDs 1802. The LEDs 1802 define subpixels 1803 that may be incorporated into a flexible display. The subpixels 1803 are spaced apart a horizontal distance hi that forms a subpixel gap 1808. A group of LEDs, such as three LEDs, may be used to define an addressable pixel 1804 for a display. A larger array of LEDs may define a chixel 1806 which may include multiple subpixels and pixels. In the exemplary embodiment shown in FIG. 19 the chixel 1806 includes 8 rows of 12 LEDs which define 96 subpixels and 32 three-LED pixels 1804 of the chixel 1806 to provide a 4.times.8 pixel arrangement. Commands/instructions from a driver may be directed to the LEDs of the pixel grouping to manipulate the individual LEDs 1802 as subpixels so that the overall light produced by the pixel 1804 is of desired characteristics, such as a desired color and brightness.

Multiple chixels 1806 may be coupled to a flexible substrate 208 to form a flexible display 2000. For example, as shown in FIG. 20 chixels 1806 may be coupled to a flexible substrate 208 in an arrangement 2202. The arrangement of the subpixels 1803 on the individual chixel 1806 in conjunction with the arrangement of the chixels 1806 on the substrate 208 may be such as to provide uniform LED spacing and hence uniform subpixel and pixel spacing across the display 100. In addition, the pixel gap 306 may be uniform across the display and may be set equal to the pixel gap 308. By providing the subpixels 1802 about the edge of the chixel 1806, and removing a predetermined amount of the substrate 208 in the dicing process, the chixel gap 304 may be such that the pixel gap 306 between pixels on adjacent chixels 202 is the same as the pixel gap between pixels on the same chixel and the pixel gap is equal to the subpixel gap. This provides for a uniform display with minimal gap lines. While discussed primarily in terms of the lateral spacing of the subpixels, pixels, and chixels, the same principles apply to the spacing of the subpixels, pixels, and chixels in other directions, such as the vertical gaps.

The size of the pixels 1804 can be varied depending upon the desired resolution and use of the display. For example, the size of the subpixels and pixels 1804 within a chixel 1806 incorporated into a display intended for use at a viewing distance of 10 feet may be smaller than a display meant to be used at a viewing distance of 100 feet, even though the displays have the same resolution.

As discussed above, the chixels 202 may be coupled to a flexible substrate 208 to form a flexible display 100. In addition to providing support to the chixels 202 the substrate 208 may also provide additional functions, such as filtering, light diffusion, contrast enhancement, etc., and may be comprised of multiple layers. An exemplary flexible substrate 2200 shown in FIG. 22 comprises a diffusion layer 2202, a contrast enhancement layer 2204, and an outer protective layer 2206. The flexible substrate 2200 may also include an adhesive layer 2208 for coupling chixels 202 to the flexible substrate 2200 and one or more filters 2210, as well as an anti-reflective layer 2212 (not shown).

Figure 23:
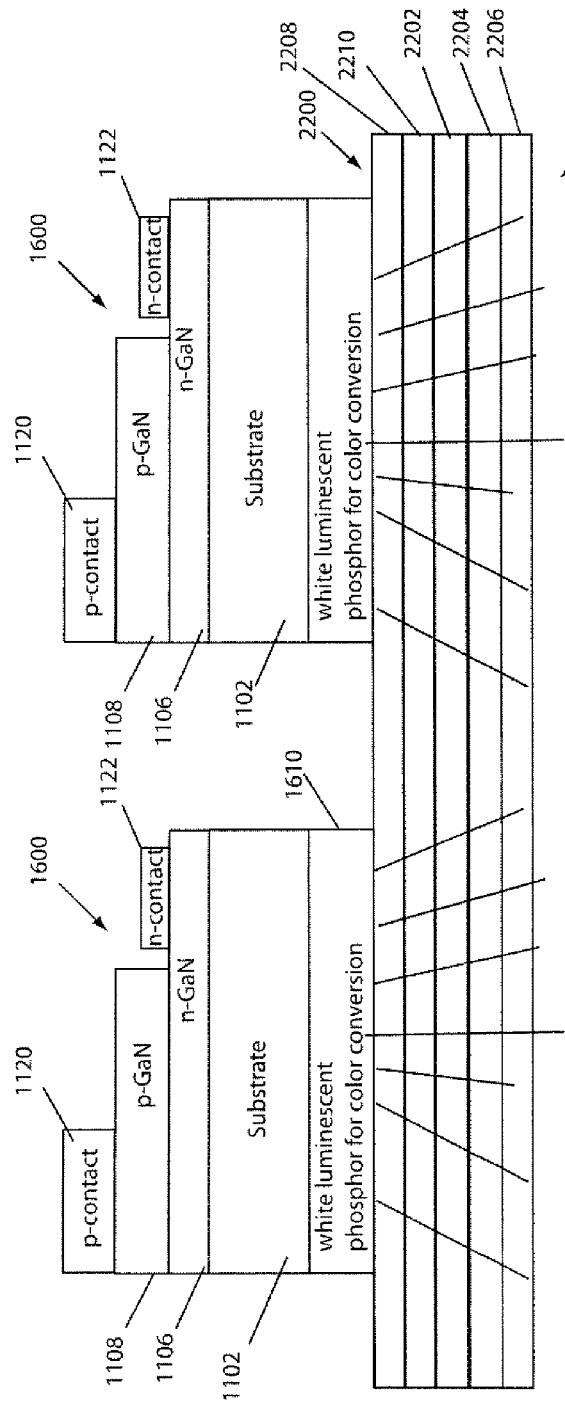
FIG. 23 shows a side view of a chixel-based display.

The chixels 1600 may be placed light-emitting end down on the substrate 208 as shown in FIG. 23 so as to emit light through the flexible substrate 2200. The exposed p 1120 and n 1122 contacts allow the display to be driven from the rear by a drive system 2402 as shown in FIG. 23, thereby avoiding the complications of providing transparent front electrodes to the LED subpixels. As discussed above with reference to FIGS. 3A-3B the chixels 1600 are arranged on the substrate 2200 so that the resulting chixel gaps 304 provide sufficient bending areas to give the substrate 2200 a desired amount of flexibility. The drive means may address the subpixels in predetermined pixel groupings.

Figure 22:
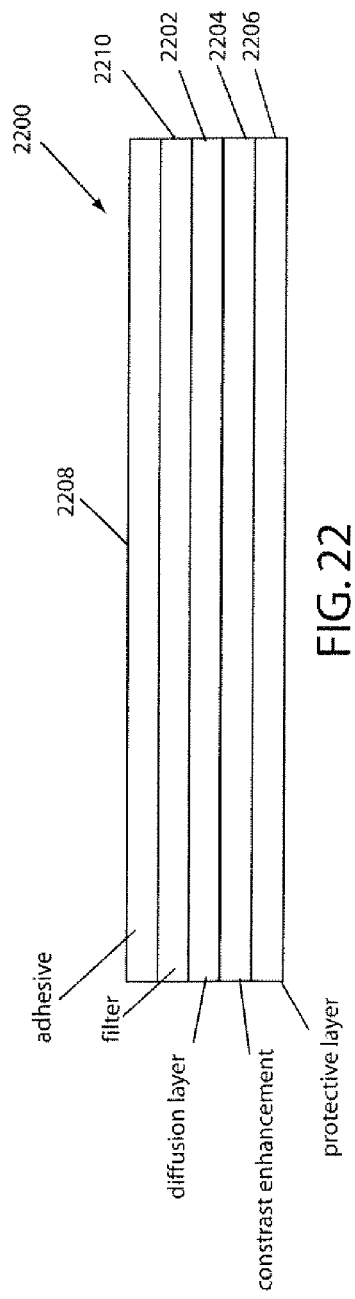
FIG. 22 shows a display substrate in accordance with one embodiment of the invention.
Figure 26:
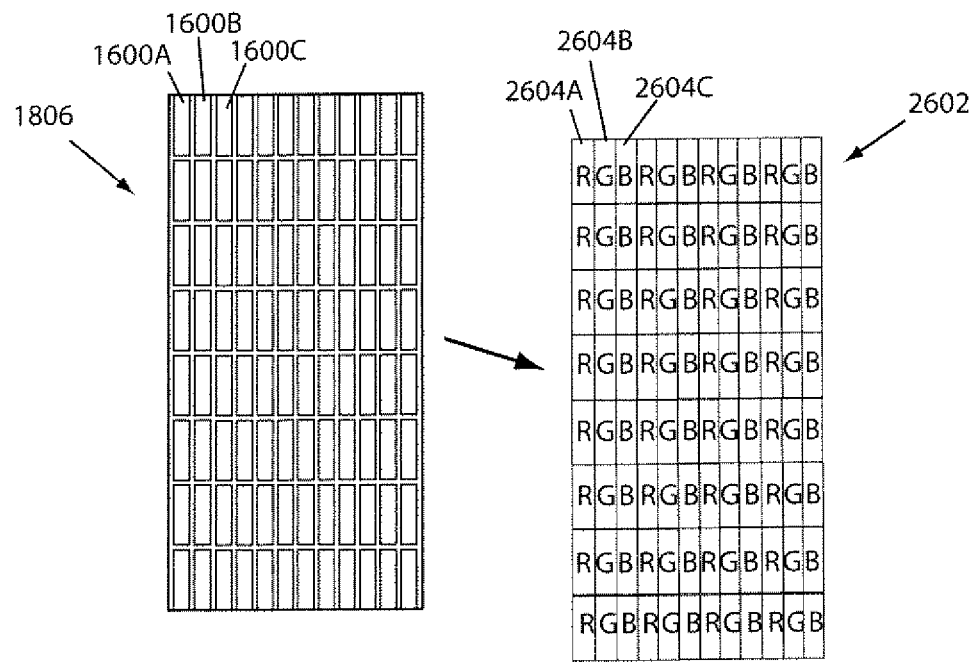
FIG. 26 shows a chixel and filter arrangement for a chixel-based display in accordance with an one embodiment of the invention.
Figure 27:
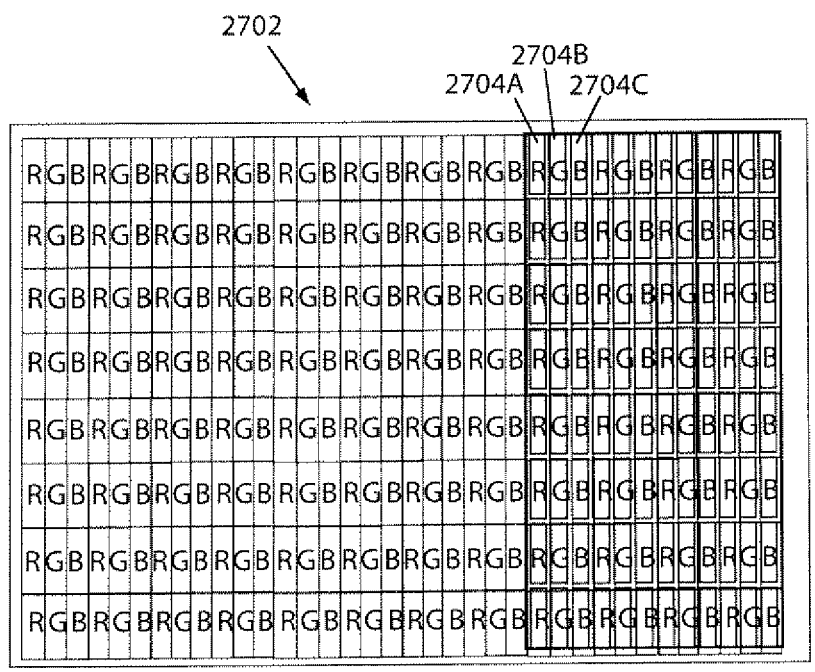
FIG. 27 a chixel-based display incorporating the chixel and filter of FIG. 26.

As shown in FIG. 22 the substrate may be provided with one or more filters 2210 to manipulate the light emitted from the LED light emitters. For example, an array of color filters can be printed, sprayed or otherwise provided to the substrate 2200. As seen in FIG. 26 a red-green-blue filter arrangement 2602 having filter portions 2604A, 2604B, 2604C of red R, green G and blue B may be added to the substrate assembly 2200 to form a filtered substrate 2702 with filter portions 2604 that correspond with the different LED light emitters 1600A, 1600B, 1600C of a chixel 1600. The chixel 1600 is coupled to the filtered substrate to form a color display 2700 so that the light emitters 1600 align with the filtered portions 2604 to form RGB pixels 2702A, 2702B, 2702C as shown in FIG. 27.

Figure 24:
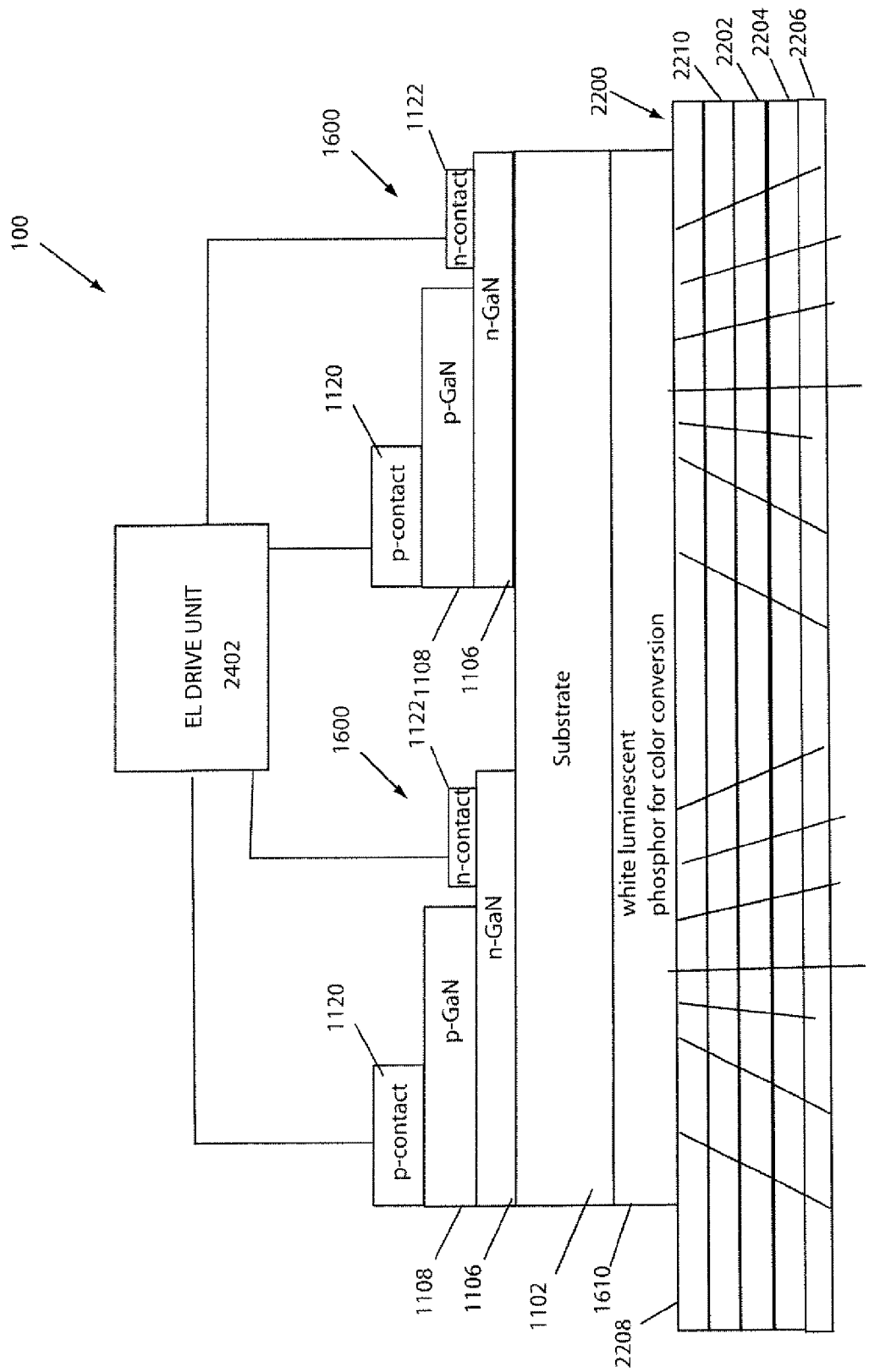
FIG. 24 shows a flexible chixel-based display in accordance with one exemplary embodiment of the invention.
Figure 25:
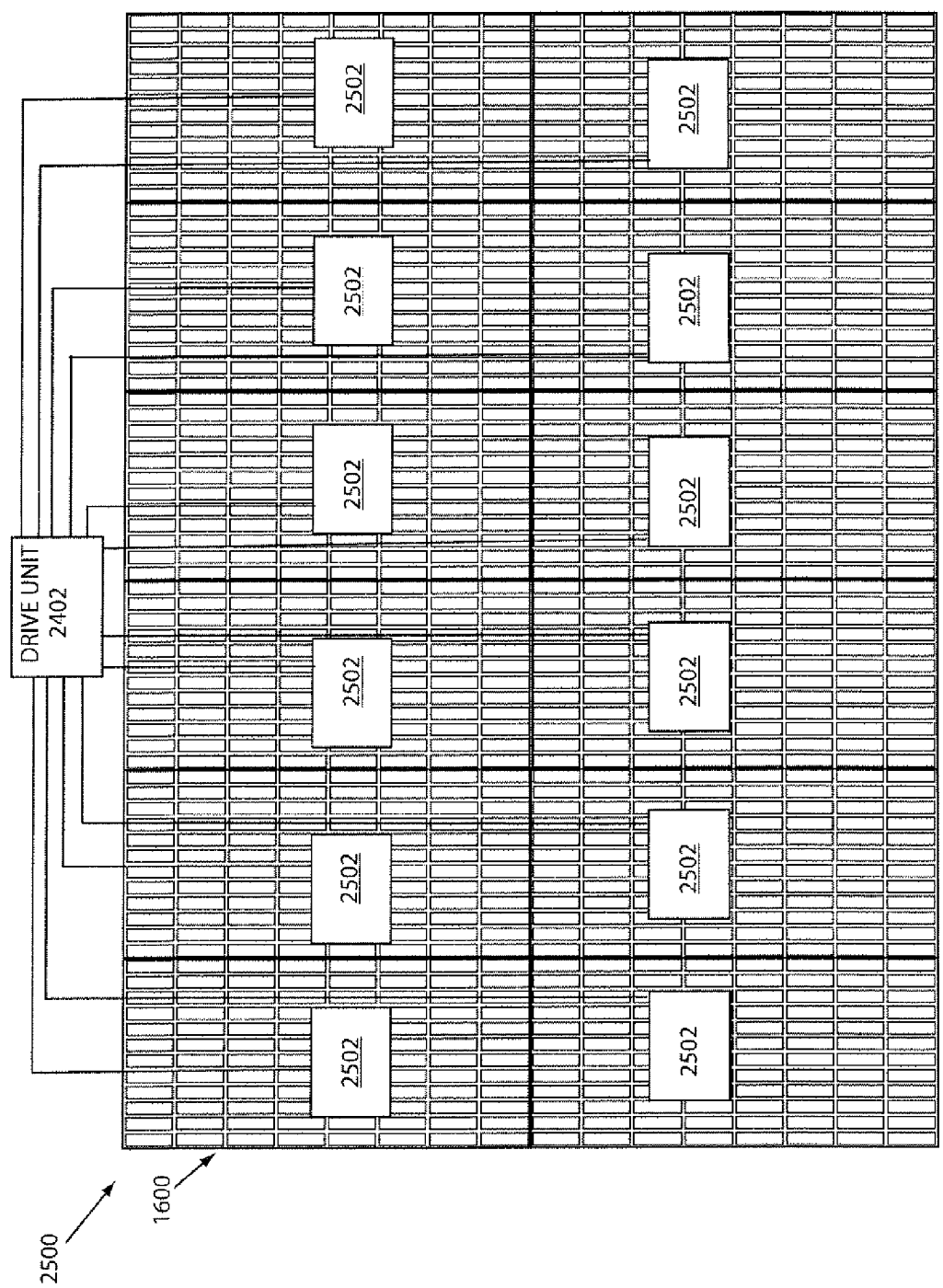
FIG. 25 shows a flexible chixel-based display having dedicated controllers for each chixel.

As shown in FIG. 24 drive means 2402 may be provided to the chixels to provide the necessary power and commands to make the light emitters of the chixels emit light in a desired manner. The drive means 2402 may include drive electronics as known in the art. In the exemplary embodiment shown in FIG. 25, a controller 2502 is provided for each chixel. The controller 2502 may comprise a data line and a power line that controls the emission of light from each of the light emitters on a particular chixel 1600. By providing individual chixels with a controller 2502, chixel units can be provided which can be premade and ready to install in a display.

Other filter arrangements may be provided in lieu of the standard RGB filter arrangement discussed above, in which each filter covers a single light emitter. For example, in the exemplary embodiment shown in FIGS. 28-30 edge filters 2804 are arranged horizontally to cover portions of more than one light emitter. These edge filters further minimize the effect of the chixel gaps 304. In addition, the chixels may be sized to include edge light emitters in addition to standard three-subpixel multiples.

Chixel gaps may to be more noticeable when the display 100 is flexed into a non-flat condition. As shown in FIG. 28 in addition to the standard lateral RGB filter arrangement of the filter arrangement 2602 in FIG. 26, the filters that correspond to light emitters 1600 at the outer edge of a chixel 2802 referred to as edge emitters 2810 may be sized and shaped to cover edge emitters of two adjacent chixels 2802. For example, edge filters 2804 may be provided to bridge the chixel gap 304 between adjacent chixels 2802 and cover edge light emitters 2810 on each chixel 2802. These edge filters 2804 may be oriented horizontally and may be of a size as to together cover an edge light emitter 2810 on adjacent chixels 2802 in a vertical RGB arrangement. For example, as shown in FIG. 28 a row of 14 light emitters 1600 on a chixel 2802 include 12 center light emitters and two edge emitters 2810. The chixel 2802 may be arranged on a filtered substrate 2906 having vertical filter portions 2604 and edge filters 2804 so that the center 12 light emitters 1600 correspond with a row of 12 vertically oriented red 2604A, green 2604B or blue 2604C filters and the two edge light emitters 2810 correspond with colored edge filters 2804A-C.

Instead of covering a single light emitter on one chixel, the edge filter are sized and oriented to cover an edge light emitter 2810 on each chixel thereby bridging the chixel gap. In addition, the edge filters may be of a size such that multiple edge filters cover the adjacent light emitters. For example, red, green and blue edge filters may be arranged to cover adjacent edge light emitters in a vertical RGB pattern. The same may be done along the upper and lower edges of adjacent chixels. In addition to having the 12 RGB filters which correspond to 4 RGB pixels, an extra light emitter may be provided at each edge of the chixel to form a row of 14 light emitters. Thus, when two chixels are placed next to one another two edge pixels/light emitters are adjacent one another. It should be noted that while the subpixels and filters are generally discussed as corresponding with a single light emitter, filters may cover multiple light emitters. For example, a subpixel of a chixel could include three vertically aligned light emitters which could be cover by a red filter to define a red subpixel.

FIG. 31 shows another exemplary filter pattern 3102 that may be used in conjunction with a chixel 2802 in which upper and lower edge filters 3104 are elongated to filter adjacent upper and lower light emitters 2820 across the chixel gap 304 in FIG. 32. Although each upper edge filter 3104 is shown as a single color filter that covers two adjacent light emitters from adjacent chixels 2802A-B, the filters could be sized so that each light emitter is covered by a red, green, and blue filter.

FIG. 33 is a front isometric view of a lightweight electronic sign 1000. Electronic sign 1000 consists of a plurality of display modules 1100 carried by a mounting frame 1110 which is designed to provide optimum off-axis viewing. The lightweight electronic sign 1000 may be mounted from a ceiling or a wall. In the preferred embodiment, lightweight electronic sign 1000 is intended for use within a facility such as a conference room, hotel lobby, or the like. The lightweight structure is integrated into a single unit for easy portability.

Figure 34:
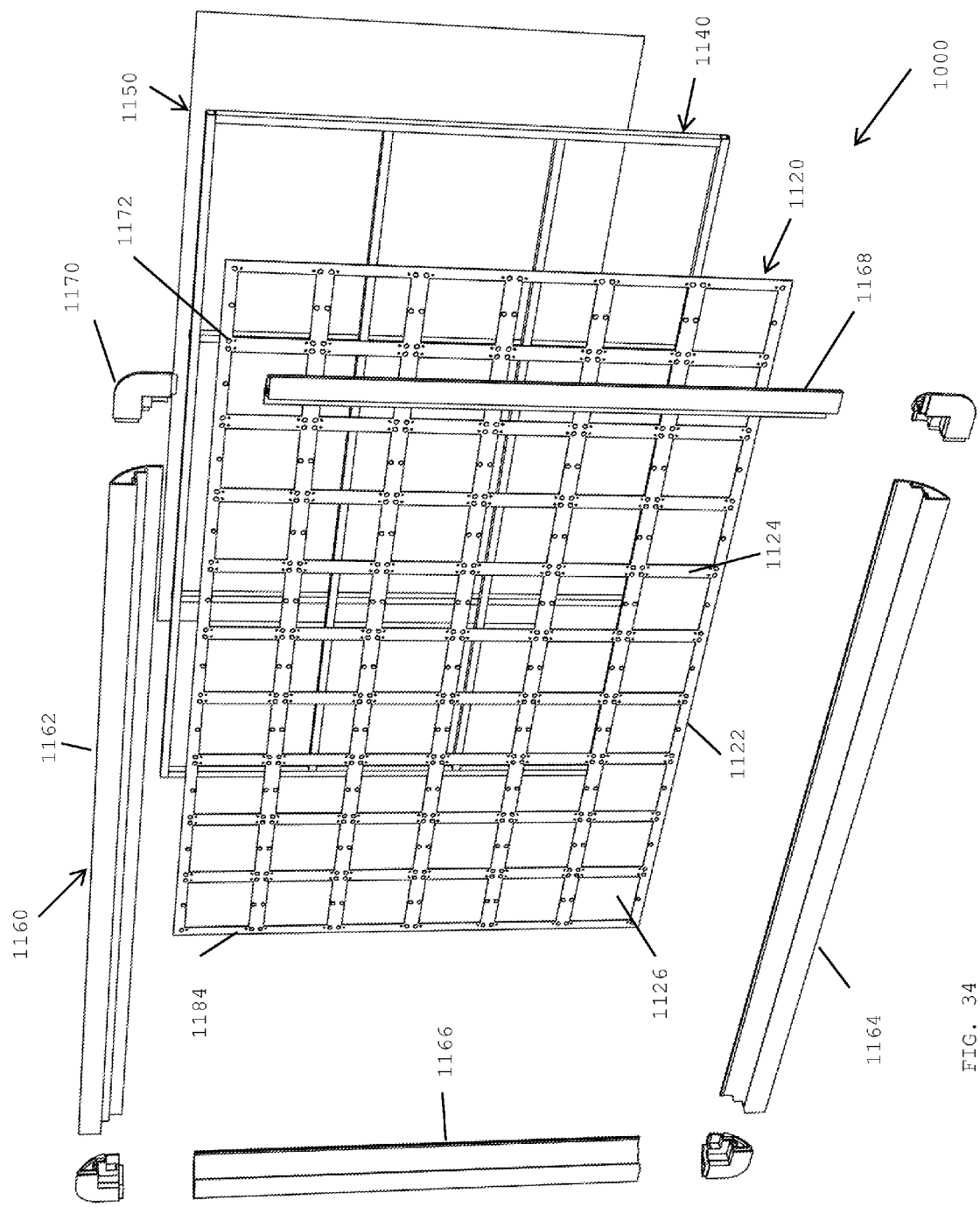
FIG. 34 is a front exploded assembly view of an electronic sign according to an additional embodiment of the present invention.
Figure 35:
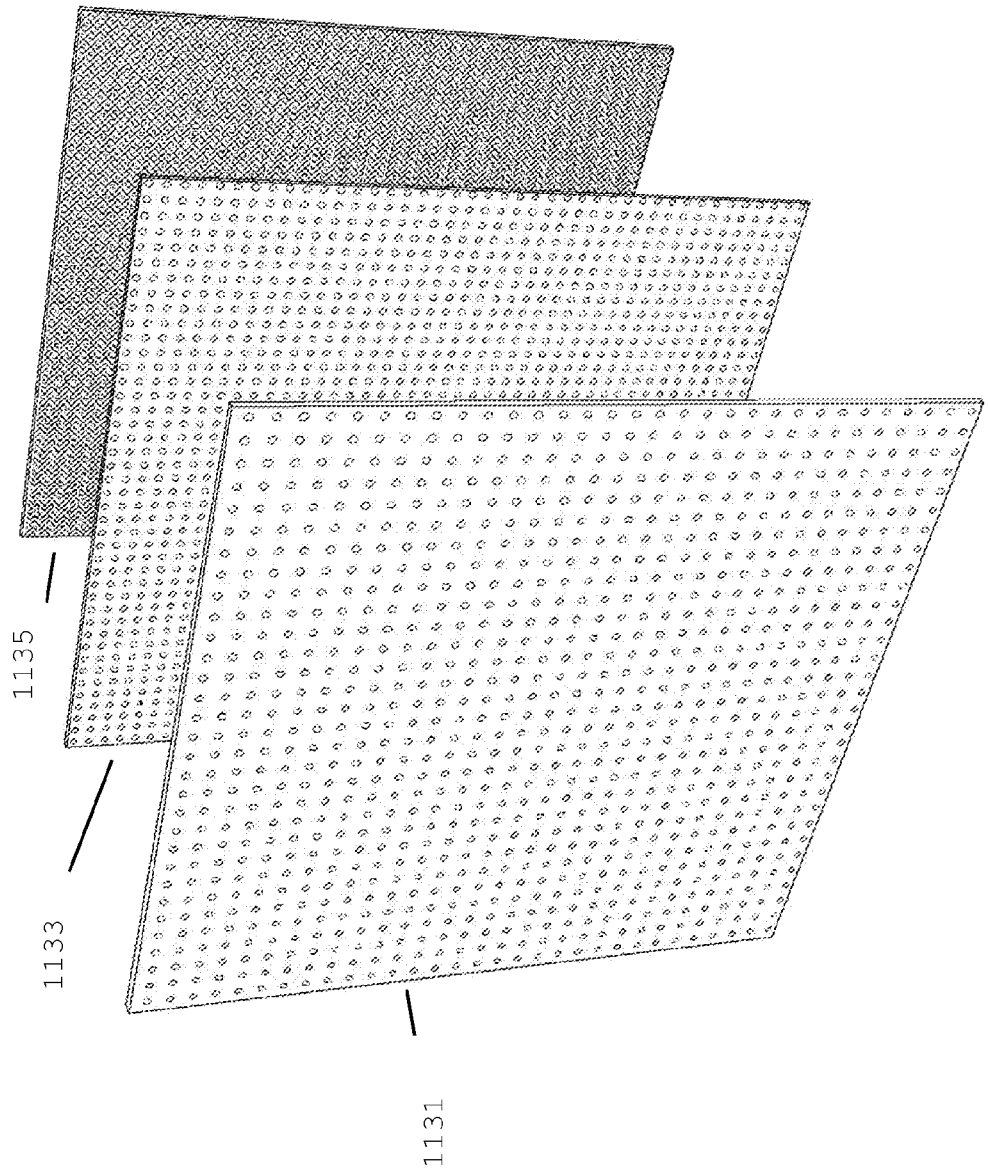
FIG. 35 is a view illustrating the various display modules for a kit assembly for manufacturing an electronic sign according to an additional embodiment of the present invention.

FIGS. 34 and 35 illustrate the components of lightweight electronic sign 1000. A module display mounting frame 1120 carries a plurality of display modules. A display mounting support frame 1140 is carried by a rear surface of display mounting frame 1120. An electronic support member 1150 is disposed preferably disposed rearwardly of support frame 1140. The display mounting frame, display mounting support frame, and electronic support frame are carried by an externally positioned outward frame 1160. In the preferred embodiment, outward frame 1160 consists of upper and lower horizontal frame members 1162 and 1164, left and right vertical frame members 1166 and 1168, and respective frame corner pieces 1170.

In the preferred embodiment, display mounting frame 1120 is formed by one or more methods including, punching, or laser cutting or combination thereof with very precise cuts of close tolerance. Mounting frame 1120 is preferably manufactured from a single piece of aluminum forming a grid-like structure having a plurality of vertical and horizontal display module mounting surfaces 1122 and 1124 which are offset defining a plurality of display module receptacles 1126. In the preferred embodiment, the precision cutting of the mounting frame 1120 provides for a singular plane which touches the outer vertical display module mounting surfaces in both the vertical and horizontal planes. In essence, the profile of the mounting frame is completely flat. A display module is received within a respective display module. Each display module carries a plurality of optical display sources such as pixel devices which may consist of LEDs or similar light emitting source which are presented to the face of the display module for working in conjunction with additional displays for transmitting an overall image. For ease of assembly and operational utilization, magnets 1172 are carried by display mounting frame 1120 for releaseable attachment with respective display modules for mounting the display modules with the display mounting frame.

In the preferred embodiment, the manufacturing of the electronic sign is done in a manner to enable the fast and efficient assembly of requested signs. The respective display receiving apertures 1126 are of a uniform size throughout mounting frame 1120. Assembly preferably includes a kit of distinct display modules of similar shapes but of different density of pixels. For instance as shown in FIG. 35 display modules may consist of different pixel spacings. For instance, display module may consist of display module 1131 which has an eight millimeter spacing of pixel placements, 1133 which has a six millimeter spacing of pixel placements or 1135 which has three millimeter spacing of pixels. In the preferred embodiment, display module is a square tile preferably two hundred and fifty millimeters in both the length and width direction. By providing different pixel spacings, different resolutions of the overall display may be obtained depending on the ultimate intended purpose of the display. Additionally by providing a consistent size, a plurality of displays may be manufactured via a kit arrangement depending on the requirements of the end user.

Figure 36:
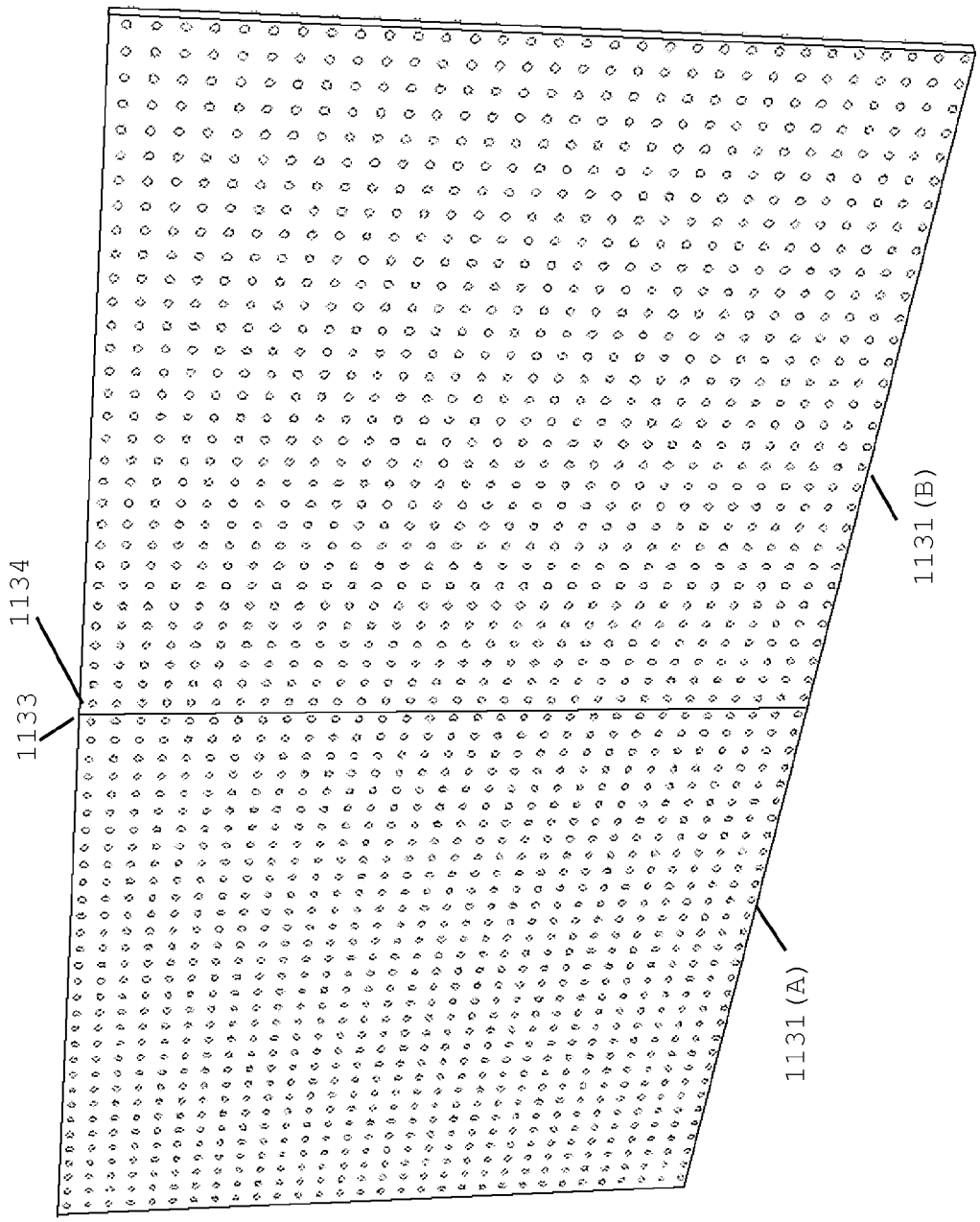
FIG. 36 is a view illustrating two display modules of the same pitch adjacent to one another illustrating the pixel gap according to an additional embodiment of the present invention.

As shown in FIG. 36, when two display modules 1131(*a*) and 1131(*b*) are integrated within the display mounting frame, the two display modules have a pixel spacing such that the gap 1133 which extends from the last vertical row of pixels to the edge of the respective display module is one half of the pixel gap. Accordingly, the gap which extends from the edge of the adjacent display module to the first vertical row of pixels 1134 in combination with the gap from last vertical row of the adjacent display module is equal to the pixel gap between adjacent pixels on a respective display module. This configuration assists in providing for off-axis viewing such that no differentiation between display modules may be perceived from an ordinary observer viewing the overall displayed design. By utilizing a uniform sized display module, the various horizontal rows of pixels align when adjacent tiles are positioned in the display mounting frame. The same pixel gap configuration also exists for display modules which are adjacent in a vertical orientation.

Figure 37:
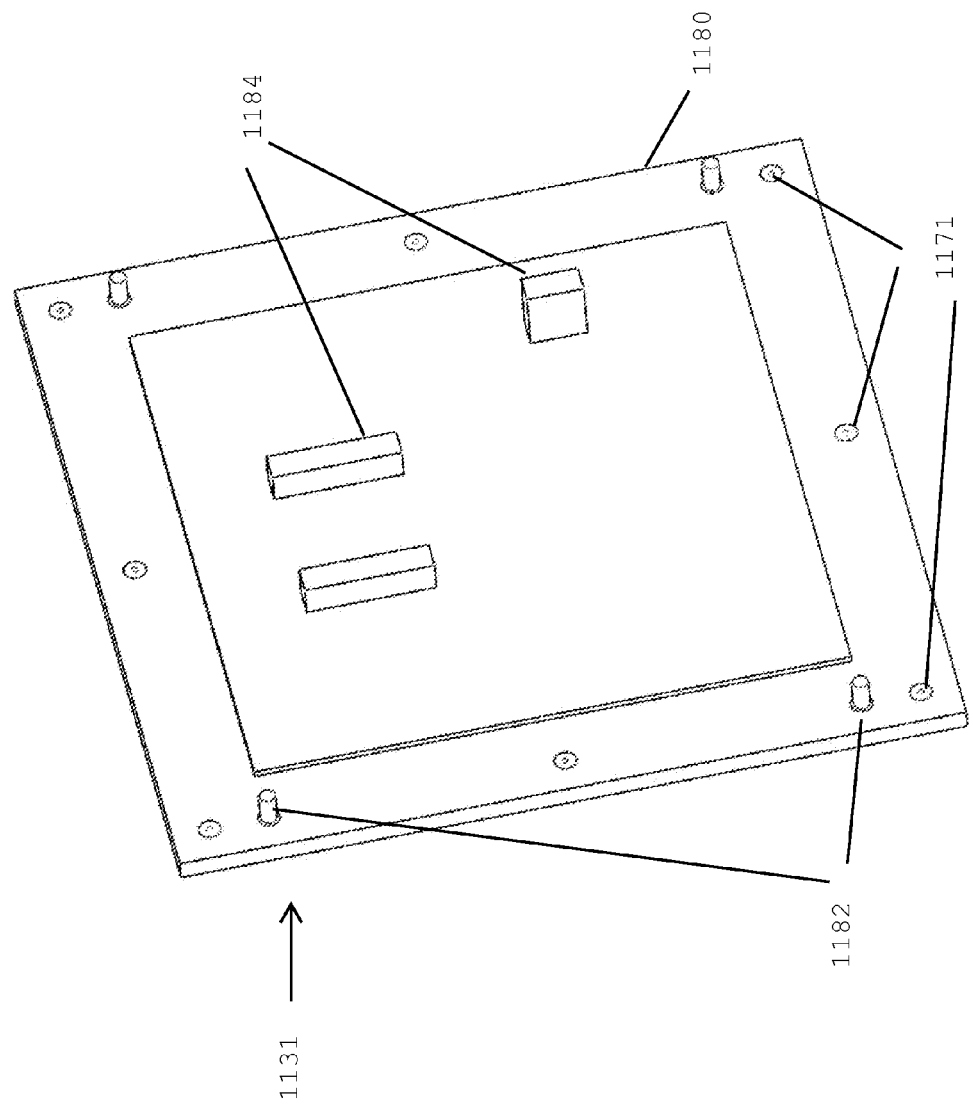
FIG. 37 is a rear view of a display module according to an additional embodiment of the present invention.

As shown in FIG. 37, the display module 1131 has a rear surface which is utilized for enabling the display module 1131 to be carried by display mounting frame 1120. In the preferred embodiment, the rear surface carries an attachment frame 1180 for interfacing with display mounting frame 1120. In the preferred embodiment, attachment frame 1180 carries a metallic portion 1171 for magnetically mating with magnets 1172 carried by display mounting frame 1120. Multiple configurations of this magnetic mating arrangement may be achieved. For instance, attachment frame 1180 may be metallic, or the magnets could be positioned on the attachment frame with a corresponding set of metallic slugs carried by the display mounting frame. In either circumstance, the magnets provide sufficient support for the display module.

The display module also includes an alignment device 1182. In the preferred embodiment, alignment device 1182 consists of a plurality of posts which are matingly received by alignment post receptacles 1184 located within display mounting frame 1120. The alignment device 1182 of each display module is positioned in the same manner and the alignment post receptacles 1184 are located in the same position with respect to each display module receptacle 1126 such that each display module 1131 may be positioned anywhere within the display mount frame. Also, the relationship of the alignment device and the magnetic attachment devices are such that the display modules are each positioned with respect to the display attachment frame such that a flat plane is established in both the horizontal and vertical directions.

Display modules 1131 also include a plurality of connectors 1184 for attaching to various electrical components of the lightweight display. Connectors 1184 are positioned within the profile defined by the alignment device and magnetic attachment devices such that the connectors will extend into the display receptacles defined within display mounting frame 1120.

Figure 38:
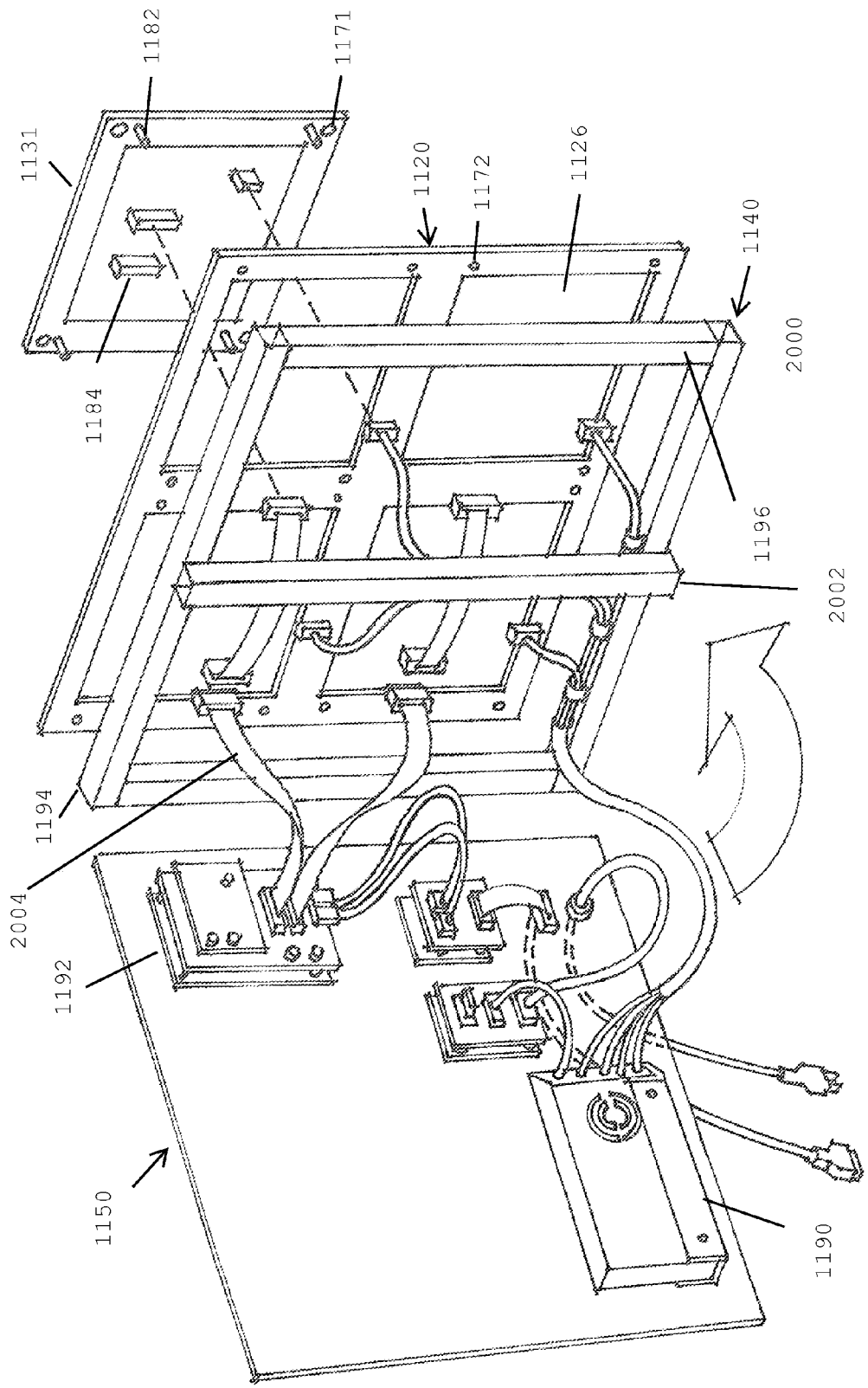
FIG. 38 is an exploded rear view of a light weight sign illustrating the assembly of components.

FIG. 38 is an exploded view of the lightweight display illustrating the relationships of the various components of the display. Display module 1131 is aligned with display mount frame 1120 such that alignment device 1182 is received via alignment receptacles 1172 enabling magnetic attachment device 1171 to secure the display module with the display mount frame. The electrical connectors 1184 pervade through the display mount receptacle 1126.

A display mounting support frame 1140 is positioned rearwardly of display mount frame 1120. Display mounting support frame 1140 consists of a plurality of horizontal support beams 1194 and vertical support beams 1196. Depending on the ultimate size of the lightweight display, various configurations of horizontal and vertical support beams may be utilized. One embodiment as shown in FIG. 34 consists of four horizontal and four vertical support beams. These beams also define an open receptacle enabling access to the electrical connectors of the display module.

Electronic support member 1150 is preferably a rigid board which is structurally sufficient for supporting a plurality of electrical devices. Such devices preferably include power supplies 1190, and display circuit boards 1192. The electrical devices are interconnected with the display modules via wiring, ribbon cable 2004 and the like. Preferably, each display module is connected with a separate display module such that each display module is ultimately connected with a display circuit board. In this manner each display module may be provided electrical control signals. Additionally, by having a system wherein a plurality of display modules are interconnected, these display modules are able to provide a reference to each other enabling the sign to ultimately display the desired display. Preferably, wires are tied together and positioned along the support beams to reduce congestion.

In addition to the support beams, spacing beams 2002 are carried by display mounting support frame 1140. In the preferred embodiment, electrical support member 1150 abuts spacing beams 2002 defining a rearward enclosure. In the preferred In the preferred embodiment, preferably the entire depth of the display is less than four inches from the front of the display to the rear portion of the display. This compact construction is enabled by facilitating the placement of the electrical components within the periphery defined by the display mounting support frame and the display mounting frame.

Figure 39:
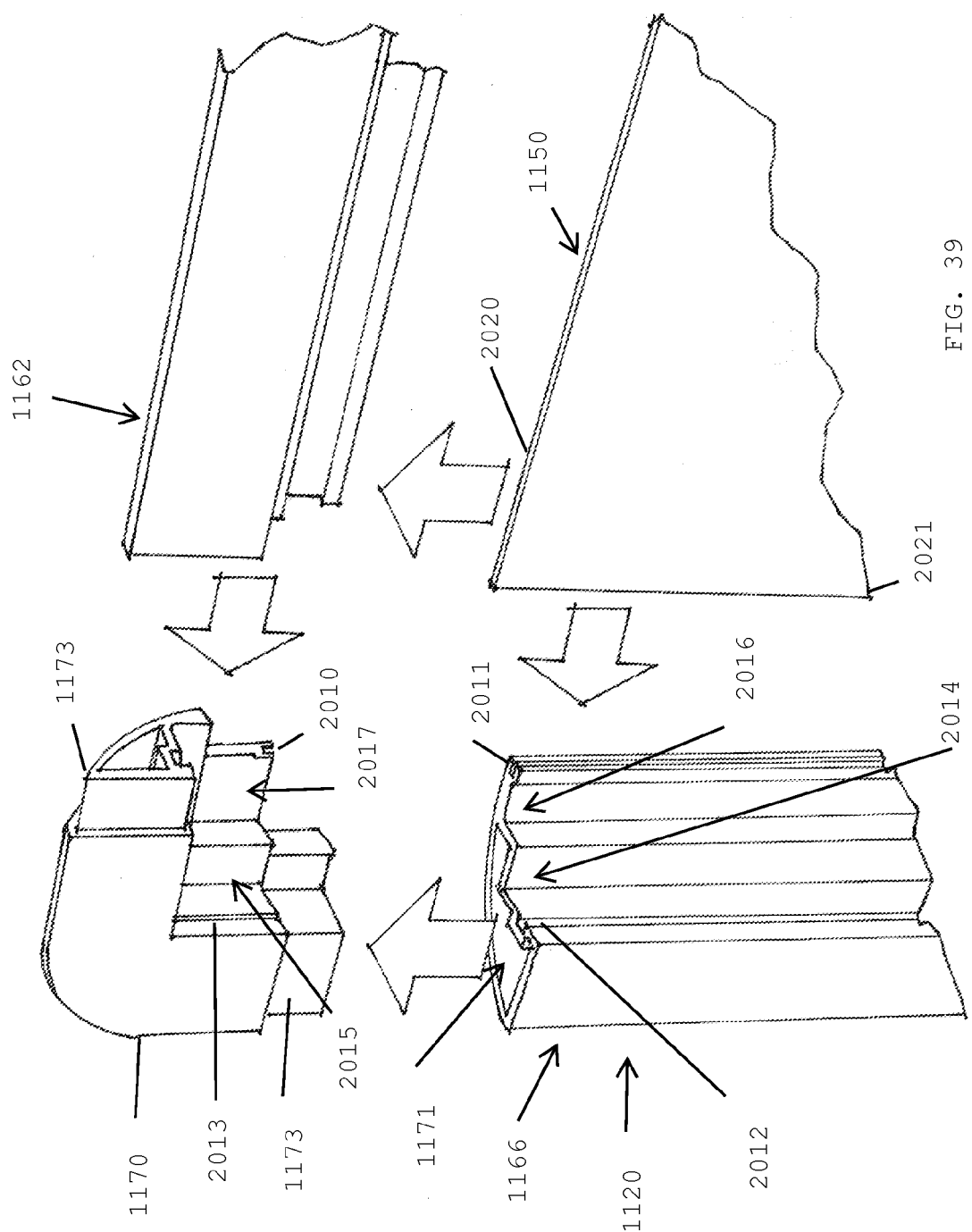
FIG. 39 is a perspective view illustrating the assembly of the frame components of an additional embodiment of the present invention.
Figure 40:
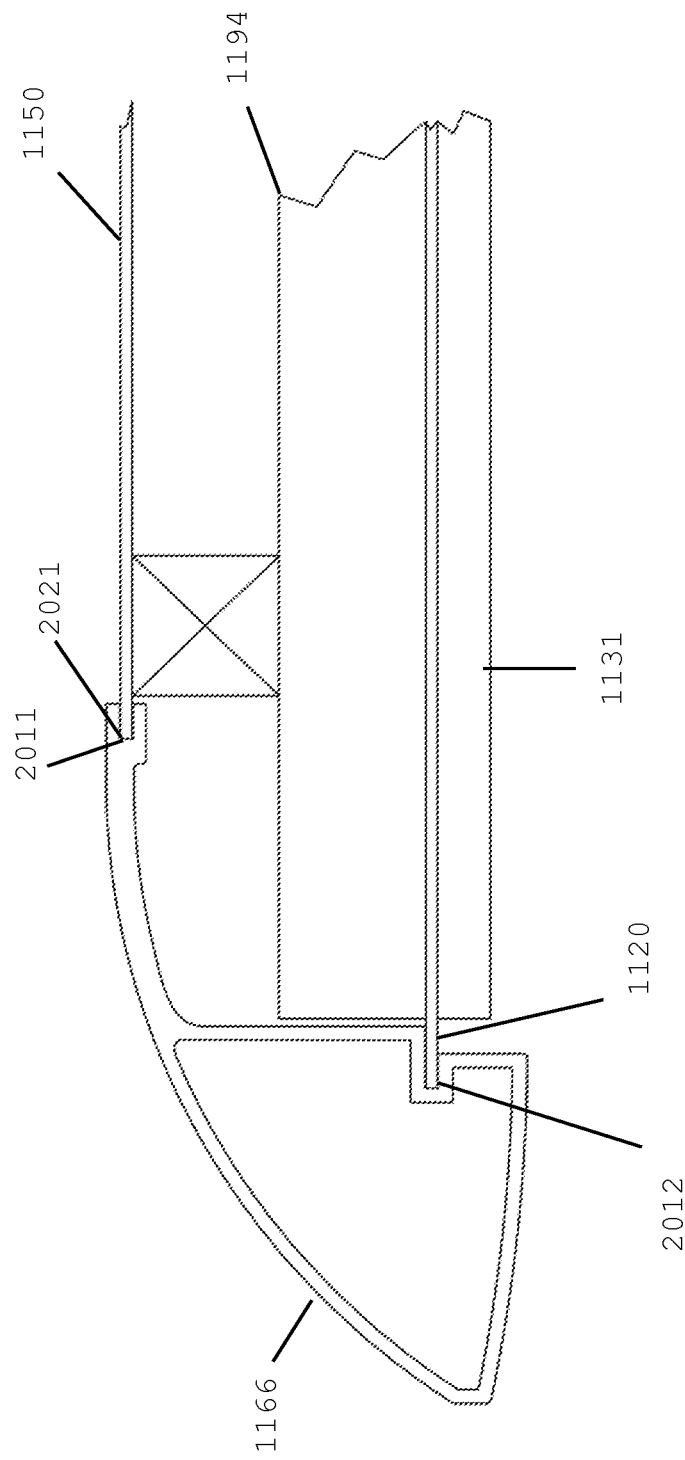
FIG. 40 is a cross-sectional view illustrating the mating relationships of the components of the electronic sign of an additional embodiment of the present invention from a top-down view.
Figure 41:
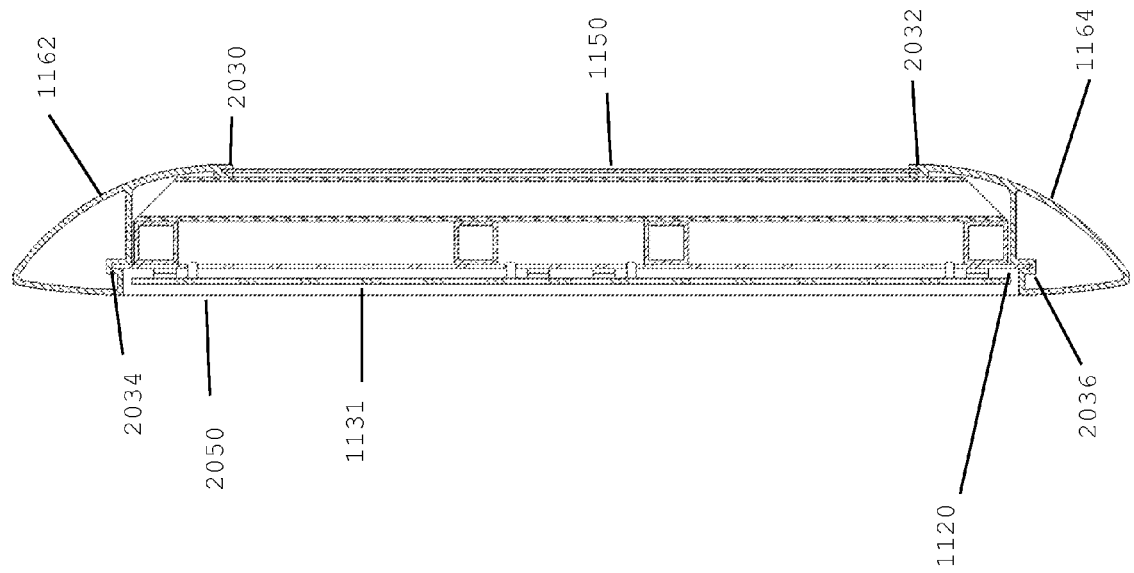
FIG. 41 is a cross-sectional illustrating the mating relationships of the components of the electronic sign of an additional embodiment of the present invention from a side view.

FIGS. 39-41 illustrate the mating relationship of the external frame members with the additional components of the lightweight display for establishing a secure, solid and compact display. As shown in FIG. 39, upper horizontal frame member 1162 is matingly adapted for receiving corner piece 1170. Additionally, vertical frame member 1166 is matingly adapted for receiving corner piece 1170. Preferably both horizontal and vertical frame members are manufactured from extruded aluminum. The extrusion establishes a corner piece receptacle interior 1171 for receiving a connecting barb 1173 of corner piece 1170. Both the horizontal and vertical frame members include corner piece receiving interior 1171 for receiving the respective connecting barbs 1173 of corner piece 1170. Of course the construction may be had where the barbs are contained on the respective frame members and the corner piece has a receptacle for receiving the barbs. Or alternatively the barbs may be constructed as individual pieces for mating engagement with interiors of the extruded frame members and an extruded corner piece. However, in the preferred embodiment, it is desired that the vertical and horizontal frame members are constructed from extruded frame members which are cut to the desired length. In this manner, the manufacturing process would be best served having the barbs integral with the corner pieces.

The horizontal, vertical and corner pieces are configured for defining receiving positions for the components of the lightweight display. In particular, corner piece 1170 preferably includes a mating receptacle for electronic support member 1150. In the preferred embodiment, the mating receptacle is a groove 2010 with dimensions for providing a snug fit with the upper surface 2020 of electronic support member 1150. Additionally, vertical frame member 1166 includes a mating receptacle for electronic support member 1150. In the preferred embodiment, the mating receptacle is a groove 2011 for providing a snug fit with the side surface 2021 of electronic support member 1150. In this manner, the electric support member 1150 is securely carried by externally positioned outward frame 1160. Also, display mounting support frame 1140 having a vertical side edge is constructed to fit within display mounting support frame receptacle 2012 defined along the length of vertical frame member 1166 for providing a snug supporting fit. Corner piece 1170 has a similar groove or notch 2013 for receiving an upper portion of the display mounting support frame 1150.

A cross-sectional view of the intricate and snug construction of the preferred embodiment is shown in FIG. 40. Extruded vertical frame member 1166 extends from the display modules 1131 rearwardly to the electronic support member 1150. The extruded vertical frame member 1166 carries both the display mounting frame 1120 within display mounting support frame receptacle 2012 which is preferably a groove along the length of the extruded vertical frame member at least as long as the vertical height of display mounting frame 1120. Preferably this groove is of a width which provides frictional engagement with display mounting frame 1120. Additionally, electronic support member 1150 is also simultaneously carried by extruded vertical frame member 1166 via groove 2011. Groove 2011 is preferably of a width which provides frictional engagement with electronic support member 1150.

FIG. 41 illustrates the compact construction of the lightweight display from a side view. In the preferred embodiment, the overall width from the front of the extrusion vertical frame member to the rear is preferably four or less inches. The groove which captures the display mounting frame is approximately point zero eight inches. As seen in FIG. 41, horizontal frame members 1162 and 1164 include an electronic support member groove 2030 and 2032. As with the other grooves, these grooves are sized for frictional engagement with the upper and lower surfaces of electronic support member 1150. Additionally, horizontal frame members 1162 and 1164 include display mounting frame grooves 2034 and 2036. Preferably these horizontal frame members have an upper and lower support frame support members 2040 and 2042 for abutting against the horizontal frame members of support frame 1140 for a snug fit preventing upward or downward movement of the support frame. FIG. 41 also illustrates the flush planar configuration of the display modules 1131 which are mounted on top of each other with their respective alignment pins received within display mounting frame 1120 and the magnetic attachment of the respective display modules with the display mounting frame 1120. In the preferred embodiment, a clear screen 2050 is configured for extending over the upper and lower profiles of the respective display modules in a "C" cap configuration. Clear screen 2050 abuts the horizontal frame members 1162 and 1164.

As can be seen in FIGS. 39-41 a slim and structurally sound configuration for a lightweight display may be had according to the invention. Preferably to provide a compact construction the electronic support member is smaller than the display mounting frame, accordingly the horizontal frame members are curved to affix to each structure. Furthermore, in the preferred embodiment, slots are formed within the horizontal frame structure to provide cooling of the electrical components.

A thin display mounting frame which is precisely cut provides both a flat vertical and horizontal plane for mounting a plurality of video displays provides initial support for the display modules. A secondary support frame manufactured from extruded aluminum provides lightweight support. A third lightweight board supports the electronics necessary for running the display. A lightweight extruded peripheral frame structurally holds these three components together. By providing for slots or grooves within the horizontal and vertical frame members, the display mounting frame and electronic support frame are supported generally along the entire length of their periphery. This construction provides for a secure assembly. Additional recesses are defined within the vertical frame members for abutting against the vertical members of the support frame while the horizontal upper and lower frame members of the peripheral frame abut against the upper and lower horizontal frame members of the support structure to provide for structural support along the four sides of the support frame.

The preferred embodiment of the invention consists of a kit which enables mass production of various displays. As noted, each display module has a predetermined size notwithstanding the pixel displacement for the respective module. The display mounting support frame has display module receptacles for receiving each display module with alignment holes and magnetic attachment devices located consistently throughout the surface area of the display mounting support for consistently receiving, supporting and aligning the display modules to provide an arrangement wherein the pixel gap between adjacent pixels remains constant in both a vertical and horizontal direction within a particular display module and between adjacent display modules. The magnetic attachment enables for easy removal of the respective display modules enabling access to the electronic components carried by the rear electronic support frame. In this manner, various configurations of lightweight displays may be manufactured utilizing a kit of display modules. Only the height and width of the display mounting frame will be variable.

To further assist on the manufacturing, the outward frame of the preferred embodiment consists of a singular design of an extruded frame member. This frame member may be extruded to any length and then cut to size. By providing for slots within the extrusion for receiving the display mounting support frame and the rear electronic support frame, the slots can be utilized along a vertical height or a horizontal length. With the consistent cross section and positioning of the grooves, a simple process may be had by providing a singular extrusion. The respective extrusions are connected utilizing a uniform corner piece which may be used for all four corners of a rectangular display design. Of course, while a preferred embodiment consists of a singular extruded design, a possible alternative is utilizing a particular extrusion configuration for horizontal frame members only and a second extrusion configuration for the vertical frame members.

In this manner a kit for assembling would consist of a plurality of display modules of various pixel densities which would be chosen depending on the desired resolution of the finished lightweight design, at least a singular extrusion for defining an outward frame member which could be cut to the desired display size, a plurality of similar constructed corner pieces, a rear electrical board which can be cut to size and a plurality of extruded support beams would could be welded to a desired configuration for supporting the desired display. This ease of manufacturing provides for a simple construction of a lightweight display with minimum components. In practice only the display mounting support frame needs to be customized for the respective size of the ultimate display, the remaining components consist of general construction supplies such as the extruded beams which are merely cut to size.

Accordingly, with this construction, the depth of various displays maintain the same while the height and width of the various designs may be modified. By providing for a constant pixel gap, off-axis viewing is enabled.

In practice the following lightweight constructions were developed:

|  | Screen Size | | | |
| --- | --- | --- | --- | --- |
|  | 114 Inches | 151 Inches | 180 Inches | 224 Inches |
| Brightness | 1500 nits | 1500 nits | 1500 nits | 1500 nits |
| Contrast Ratio | 3000:1 | 3000:1 | 3000:1 | 3000:1 |
| Resolution | 400 × 240 | 520 × 280 | 640 × 360 | 800 × 440 |
| Weight | 90 lbs | 100 lbs | 120 lbs | 120 lbs |
| Power | less than coffeemaker | | | |
| Depth | 4 inches | 4 inches | 4 inches | 4 inches |
| Aspect Ratio | 1.67 | 1.75 | 1.77 | 1.82 |

Figure 42:
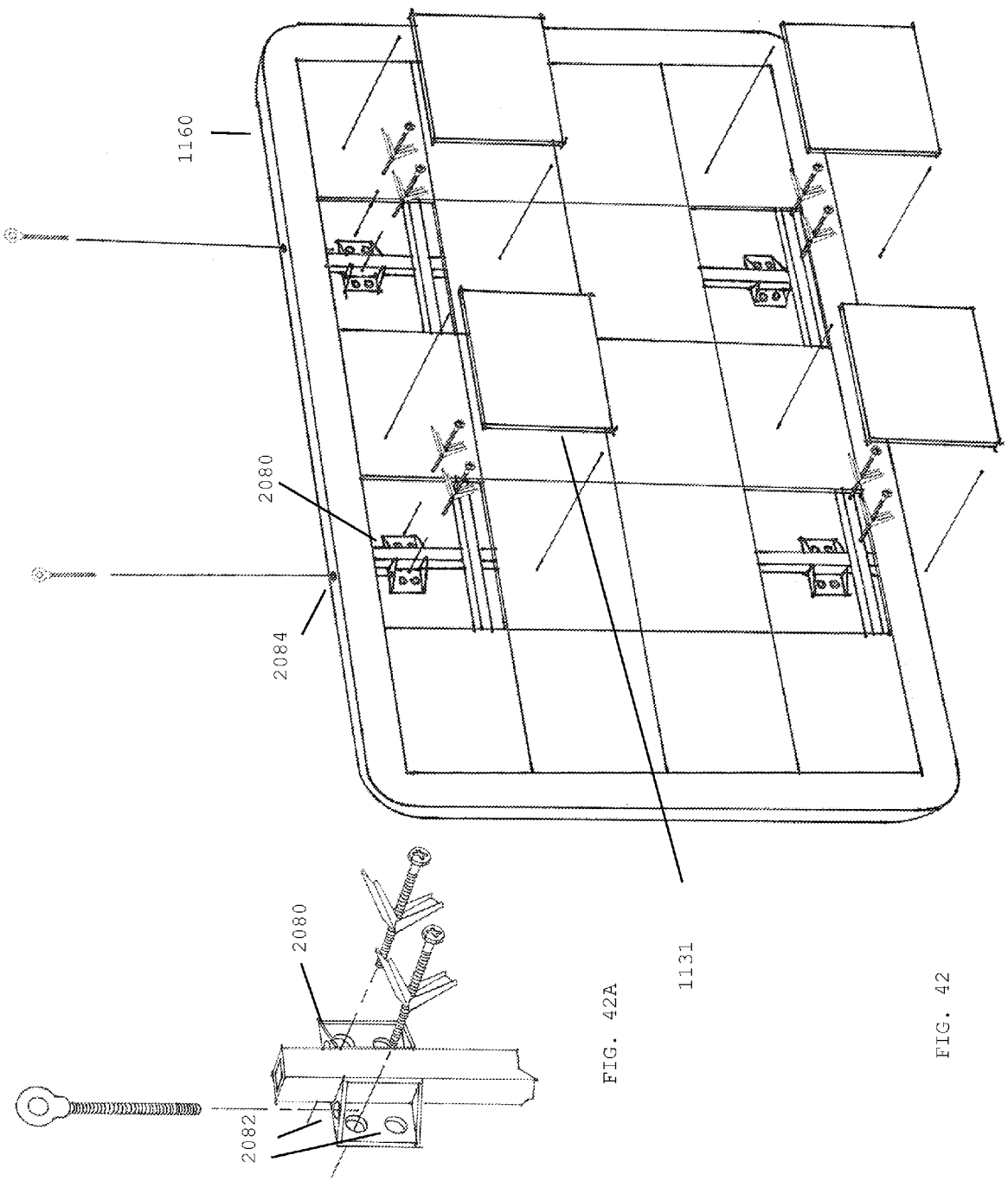

As shown in FIGS. 42 and 42A the lightweight display may be vertically hung or mounted utilizing wall mounts which are generally flush with the rear of electronic support member 1150. In the preferred embodiment, frontal access to the interior of the display may be achieved by removing the respective display modules from the display mounting frame. This is enabled by the easily detachable magnetic support mechanism utilized for securing the respective display modules to the display mounting support frame. In the preferred embodiment, mounting brackets 2080 are carried by certain support beams of support frame 1140. In the preferred embodiment the mounting brackets consist of a plurality of receptacles 2082 for receiving bolts. In the preferred embodiment mounting bracket 2080 consists of vertical and horizontal bolt holes for either receiving a horizontally mounted display or a vertically hung display. To facilitate horizontal mounting, upper beam member of outward frame 1160 includes a plurality of apertures 2084 aligned with the respective bolt holes of the mounting brackets. In the preferred embodiment certain apertures have been cut into the electronic support member. By providing for a common mounting structure, the lightweight display may easily be moved to a separate location and mounted utilizing the stationary mounting brackets.

Figure 43:
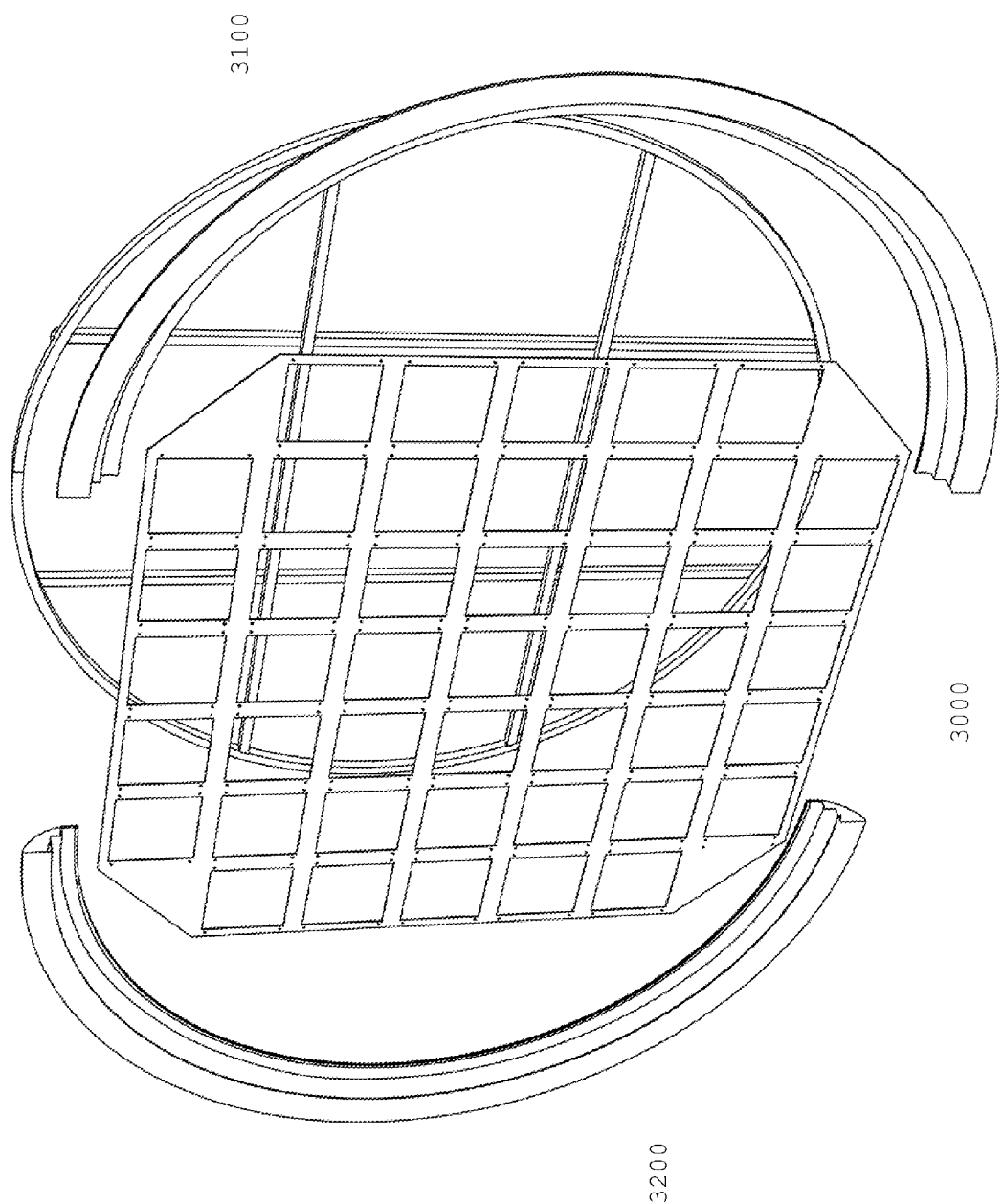
FIG. 43 is an exploded view of an electronic sign having an alternative display configuration according to an additional embodiment of the present invention.

FIG. 43 illustrates an alternative to configuration to a rectangular configuration. An oval configuration is illustrated consisting of a non-rectangular display mounting support frame 3000, a non-rectangular support frame 3100 and an extruded outer frame 3200 having a plurality of grooves for structurally receiving the display mounting support frame 3000 and support frame 3100. This configuration is similar to the prior examples including alignment holes and magnetic attachment means for receiving display modules 1131.

Accordingly it may be that an advantage of the invention is a easy to manufacture lightweight display which provides for off axis viewing. Utilizing a common display module construction with varying pixel densities, and common extruded frame members both for an internal support frame and an external decorative frame, a plurality of lightweight display units may be constructed each having a depth no greater than 4 inches.

We claim:

1. A lightweight display comprising:
a plurality of display modules having a similar area;
a display module mounting frame having a plurality of receptacles for receiving said plurality of display modules, said display module mounting frame having a front surface for carrying said display modules and a rear surface, said display module having a perimeter extending beyond the profile of said display module mounting frame when carried by said display module mounting frame, wherein said display modules are carried by said display module mounting frame utilizing magnetic attraction;
a support frame integrated with the rear surface of said display module mounting frame;
an electronic support member carrying a plurality of electronic control circuits, said electronic control circuits in electrical connection with said display modules for controlling the transmission of display signals for the establishment of a display by said display modules, said electronic support member having a perimeter; and
an outer frame having a first receptacle for receiving said perimeter of said display module mounting frame and a second receptacle for receiving said perimeter of said electronic support member.

2. The lightweight display of claim 1 wherein each display module includes an alignment device and said display module mounting frame have a plurality of alignment devices which work in conjunction with said alignment device of said display modules for aligning the attachment of said display modules with said display module mounting frame.

3. The lightweight display of claim 2 wherein said alignment device consists of a plurality of posts which are received within a post aperture carried by said display module mounting frame.

4. The lightweight display of claim 1 wherein said display modules carry a metallic device and wherein said display mounting frame caries a magnet for carrying said display module.

5. The lightweight display of claim 1 wherein said support frame carries a mounting bracket.

6. The lightweight display of claim 5 wherein said electronic support member includes at least one aperture exposing said mounting bracket to the ambient environment and wherein a respective display module may be removed from said display mounting frame exposing said mounting bracket.

7. The lightweight display of claim 5 wherein said outer frame includes a receptacle aligned with said mounting bracket enabling a vertically positioned fastener to be received via said receptacle for attachment with said mounting bracket enabling said display to be vertically mounted utilizing said support frame.

8. The lightweight display of claim 7 wherein said mounting bracket has a first set of fastener receptacles for horizontally receiving a fastener and a second set of fastener receptacles for vertically receiving a fastener thus enabling said lightweight display to be mounted either horizontally or vertically.

9. The lightweight display of claim 1 wherein said display modules have a pixel density wherein the gap between adjacent pixels both vertically and horizontally is equivalent for all display modules and wherein the spacing between adjacent pixels of adjacent display modules is equivalent to the spacing of pixels on a singular board.

10. The lightweight display of claim 1 wherein said display module mounting frame is of a height greater than said electronic support member and said outer frame member is curved for matingly engagement with said display module mounting frame and said electronic support member.

11. A kit for manufacturing lightweight displays comprising
- a first set of display modules have a first pixel density;
- a second set of display modules having a second pixel density different than said first pixel density;
- said first and second set of display modules generally having the same area;
- a display mounting frame manufactured from aluminum having a horizontal and vertical plane intersecting at 90 degrees across the entire area of said display mounting frame, wherein said display modules are magnetically connected to said display mounting frame;
- a first plurality of aluminum extruded beams for utilization in constructing a support frame, said first plurality of aluminum extruded beams capable of providing horizontal or vertical support;
- a second set of aluminum extruded beams for receiving said display mounting frame, said second set of aluminum extruded beams having an interior; and
- a set of frame corner pieces for interconnecting said second set of aluminum extruded beams forming a continuous frame around said display mounting frame.

12. The kit of claim 11 wherein said second plurality of aluminum extruded beams include at least a single groove for receiving said display mounting frame.

13. The kit of claim 12 further including an electronic support member for carrying a plurality of electrical components for controlling said display modules, said second plurality of aluminum extruded beams including a second groove for receiving said electronic support member.

14. The kit of claim 11 wherein the depth of said plurality of display modules, display mounting frame, support frame and electronic support member is less than four inches when defining a display assembly and wherein said display assembly has a screen size measured diagonally in a range of 114 inches to 224 inches and a weight in the range of 90 pounds to 120 pounds; and said display assembly has an aspect ratio ranging from 1.67 to 1.82.

15. A lightweight display comprising:
- a plurality of display modules having a plurality of pixels carried by a display mounting frame, wherein said display modules are magnetically connected to said display mounting frame;
- a support frame integral with said display mounting frame providing support;
- an electronic support member carrying electrical components electrically communicating with said plurality of display modules for controlling the display of an image;
- wherein the depth of said plurality of display modules, display mounting frame, support frame and electronic support member is less than four inches when defining a display assembly;
- wherein said display assembly has a screen size measured diagonally in a range of 114 inches to 224 inches and a weight in the range of 90 pounds to 120 pounds; and said display assembly has an aspect ratio ranging from 1.67 to 1.82.

16. The display of claim 15 including an external frame having a curved profile and matingly attaching to said display mounting frame and said electronic support member.

17. The display of claim 16 wherein said support frame and said external frame are made from extruded aluminum defining an interior and wherein said external frame includes a plurality of corner pieces designed for mating attachment with said interior of said external frame comprised of horizontal and vertical extruded aluminum frame components.

18. The display of claim 15 wherein said pixels of said display modules have a predetermined pixel gap between adjacent vertical and horizontal pixels on a singular display board and wherein said predetermined pixel gap is also present between adjacent vertical and horizontal pixels on adjacent display boards.

* * * * *